(12) United States Patent
Ikuta et al.

(10) Patent No.: US 10,847,610 B2
(45) Date of Patent: Nov. 24, 2020

(54) SEMICONDUCTOR DEVICE

(71) Applicant: PANASONIC INTELLECTUAL PROPERTY MANAGEMENT CO., LTD., Osaka (JP)

(72) Inventors: Teruhisa Ikuta, Toyama (JP); Hiroshi Sakurai, Toyama (JP); Satoru Kanai, Toyama (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 0 days.

(21) Appl. No.: 16/529,564

(22) Filed: Aug. 1, 2019

(65) Prior Publication Data

US 2019/0355809 A1 Nov. 21, 2019

Related U.S. Application Data

(63) Continuation of application No. PCT/JP2018/040887, filed on Nov. 2, 2018.

(30) Foreign Application Priority Data

Apr. 16, 2018 (JP) .................................. 2018-078235

(51) Int. Cl.
*H01L 29/66* (2006.01)
*H01L 29/06* (2006.01)
(Continued)

(52) U.S. Cl.
CPC ........ *H01L 29/0619* (2013.01); *H01L 29/404* (2013.01); *H01L 29/41725* (2013.01);
(Continued)

(58) Field of Classification Search
CPC ............... H01L 29/0619; H01L 29/404; H01L 29/41725; H01L 29/0696; H01L 29/1083;
(Continued)

(56) References Cited

U.S. PATENT DOCUMENTS 5,204,545 A 4/1993 Terashima
5,270,568 A 12/1993 Terashima
(Continued)

FOREIGN PATENT DOCUMENTS

JP H04-045578 A 2/1992
JP H05-190693 A 7/1993
(Continued)

OTHER PUBLICATIONS

International Search Report and Written Opinion dated Jan. 15, 2019 in International (PCT) Application No. PCT/JP2018/040887.

*Primary Examiner* — Vu A Vu
(74) *Attorney, Agent, or Firm* — McDermott Will & Emery LLP

(57) ABSTRACT

In a semiconductor device including first and second conductive plates (FFPs) formed by being stacked in layer, the first conductive plate and the second conductive plate include linear regions elongated to face each other along a longitudinal direction in which a length with which source region and drain region elongated in parallel face each other is longest, and are elongated in a short-side direction orthogonal to the longitudinal direction. Here, high voltage wiring of either one of source wiring and drain wiring is elongated in the short-side direction to intersect the linear regions of the first conductive plate and the second conductive plate, and low voltage wiring of the other one of source wiring and drain wiring is elongated in the short-side direction to intersect at least one linear region of the first conductive plate or the second conductive plate.

11 Claims, 19 Drawing Sheets

(51) Int. Cl.
  *H01L 29/40* (2006.01)
  *H01L 29/417* (2006.01)
  *H01L 29/786* (2006.01)
  *H01L 29/10* (2006.01)

(52) U.S. Cl.
  CPC ...... *H01L 29/0653* (2013.01); *H01L 29/0696* (2013.01); *H01L 29/1083* (2013.01); *H01L 29/786* (2013.01); *H01L 29/78624* (2013.01)

(58) Field of Classification Search
  CPC ........... H01L 29/0653; H01L 29/78624; H01L 29/786
  USPC ........................................................ 257/339
  See application file for complete search history.

(56) References Cited

U.S. PATENT DOCUMENTS

| | | | |
|---|---|---|---|
| 5,455,439 A | 10/1995 | Terashima et al. | |
| 7,125,777 B2* | 10/2006 | Cai | H01L 21/82342 |
| | | | 438/286 |
| 7,649,225 B2* | 1/2010 | Cai | H01L 21/82348 |
| | | | 257/343 |
| 8,304,830 B2* | 11/2012 | Huang | H01L 21/8249 |
| | | | 257/339 |
| 8,854,033 B2* | 10/2014 | Shiraki | H01L 23/585 |
| | | | 324/126 |
| 9,460,926 B2* | 10/2016 | Mallikarjunaswamy | |
| | | | H01L 29/66681 |
| 9,461,046 B1* | 10/2016 | Edwards | H01L 29/66681 |
| 2001/0004124 A1 | 6/2001 | Noda et al. | |
| 2002/0179974 A1 | 12/2002 | Noda et al. | |
| 2013/0277741 A1* | 10/2013 | Guowei | H01L 29/7835 |
| | | | 257/343 |
| 2016/0276477 A1* | 9/2016 | Wada | H01L 29/402 |

FOREIGN PATENT DOCUMENTS

| | | |
|---|---|---|
| JP | H07-083048 B2 | 9/1995 |
| JP | 2000-243978 A | 9/2000 |
| JP | 2001-237423 A | 8/2001 |
| JP | 2001-250870 A | 9/2001 |
| JP | 2003-068872 A | 3/2003 |

* cited by examiner

SEMICONDUCTOR DEVICE

CROSS REFERENCE TO RELATED APPLICATIONS

This application is a U.S. continuation application of PCT International Patent Application Number PCT/JP2018/040887 filed on Nov. 2, 2018, claiming the benefit of priority of Japanese Patent Application Number 2018-078235 filed on Apr. 16, 2018, the entire contents of which are hereby incorporated by reference.

BACKGROUND

1. Technical Field

The present disclosure relates to a semiconductor device with a high breakdown voltage.

2. Description of the Related Art

Japanese Unexamined Patent Application Publication No. 5-190693 (PTL 1) discloses an art of relaxing electric field concentration in a semiconductor, which is caused by a conductive film laid on the semiconductor.

Japanese Patent Publication No. 7-083048 (PTL 2) discloses an electric field concentration preventing structure for preventing electric field concentration from occurring in an end portion of a semiconductor region under a conductive layer due to an influence of the electric field from the conductive layer provided to extend across the end portion of the semiconductor region above the semiconductor region which is located on a semiconductor substrate by pn junction-isolation.

SUMMARY

However, according to the related art, there arises a problem that when the width of high voltage wiring is enlarged, a breakdown voltage may be reduced. Here, the high voltage wiring refers to wiring with a higher voltage out of wiring that is connected to a source and wiring that is connected to a drain in a semiconductor device, for example, a high breakdown voltage MOS transistor.

Thus, the present disclosure is made in the light of the above described problem, and has an object to provide a semiconductor device with a high breakdown voltage that can decrease breakdown voltage reduction that can occur when a width of high voltage wiring is enlarged.

In order to achieve the above-described object, in accordance with an aspect of the present disclosure, a semiconductor device includes: a semiconductor layer located on a principal surface of a supporting substrate; a body region located in an upper portion of the semiconductor layer, the body region having a first conductivity type; a drain region located in an upper portion of the semiconductor layer, the drain region having a second conductivity type, the drain region being apart from the body region; a source region located in an upper portion of the body region, the source region having the second conductivity type; a drift region located between the drain region and the body region in the semiconductor layer, the drift region having the second conductivity type; a first insulator region located in an upper portion of the semiconductor layer, the first insulator region being located between the body region and the drain region, the first insulator region overlapping the drift region; a gate insulation film located on the semiconductor layer, the gate insulation film being located from a part on the body region to an end portion of the first insulator region; a gate electrode located on at least part of the gate insulation film and at least part of the first insulator region; at least one first conductive plate located on the first insulator region, the at least one first conductive plate being located between the gate electrode and the drain region, the at least one first conductive plate being in an electrically floating state; a second insulator region located on the first insulator region, the gate electrode, and the at least one first conductive plate; at least one second conductive plate located on the second insulator region where at least the gate electrode and the at least one first conductive plate are not located, the at least one second conductive plate being in an electrically floating state; a third insulator region located on the second insulator region, above the gate electrode and on the at least one second conductive plate; source wiring located above the third insulator region, the source wiring electrically connected to the source region; and drain wiring located above the third insulator region, the drain wiring electrically connected to the drain region, wherein in plan view, the source region and the drain region are elongated along a longitudinal direction that is a direction in which facing lengths are longest, and are disposed side by side in a short-side direction that is a direction orthogonal to the longitudinal direction, in plan view, the at least one first conductive plate and the at least one second conductive plate each have a linear region elongated along the longitudinal direction to face each other, and a curved region connecting terminal end portions of the linear regions in the longitudinal direction in a folded line or circular arc shape, in plan view, high voltage wiring of either one of the source wiring and the drain wiring is elongated in the short-side direction to intersect the linear regions of the at least one first conductive plate and the at least one second conductive plate, and in plan view, low voltage wiring of the other one of the source wiring and the drain wiring is elongated in the short-side direction to intersect at least one of (i) the linear region of the at least one first conductive plate and (ii) the linear region of the one second conductive plate.

It is also possible that a buried insulation film is located between the supporting substrate and the semiconductor layer.

It is further possible that, in plan view, a high voltage side region of either one of the source region and the drain region is completely surrounded by a low voltage side region of the other one of the source region and the drain region, and that in plan view, the high voltage side region is completely surrounded by the at least one first conductive plate and the at least one second conductive plate.

It is still further possible that in plan view, the low voltage wiring intersects the linear region of each of the at least one first conductive plate and the linear region of each of the at least one second conductive plate.

It is still further possible that in plan view, a width in the longitudinal direction where the linear region of the at least one first conductive plate and the linear region of the at least one second conductive plate overlap the low voltage wiring is reducing or increasing toward a high voltage side region of either one of the drain region and the source region.

It is still further possible that in plan view, the source wiring and the drain wiring that intersect the linear region of the at least one first conductive plate, and the linear region of the at least one second conductive plate are elongated side by side in the longitudinal direction, and a space in the longitudinal direction between the source wiring and the drain wiring is narrower than widths in the longitudinal direction of the source wiring and the drain wiring.

It is still further possible that in plan view, a plurality of the source wirings and a plurality of the drain wirings that intersect the linear region of the at least one first conductive plate and the linear region of the at least one second conductive plate are alternately disposed in the longitudinal direction.

It is still further possible that in plan view, a ratio of a total dimension in the longitudinal direction of a part where the linear region of the at least one first conductive plate and the linear region of the at least one second conductive plate overlap the high voltage wiring, and a total dimension in the longitudinal direction of a part where the linear region of the at least one first conductive plate and the linear region of the at least one second conductive plate overlap the low voltage wiring is in a range of ⅓ to 3 inclusive.

In accordance with another aspect of the present disclosure, a semiconductor device includes: a semiconductor layer located on a principal surface of a supporting substrate; a body region located in an upper portion of the semiconductor layer, the body region having a first conductivity type; a drain region located in an upper portion of the semiconductor layer, the drain region having a second conductivity type, the drain region being apart from the body region; a source region located in an upper portion of the body region, the source region having the second conductivity type; a drift region located between the drain region and the body region in the semiconductor layer, the drift region having the second conductivity type; a first insulator region located in an upper portion of the semiconductor layer, the first insulator region being located between the body region and the drain region, the first insulator region overlapping the drift region; a gate insulation film located on the semiconductor layer, the gate insulation film being located from a part on the body region to an end portion of the first insulator region; a gate electrode located on at least part of the gate insulation film and at least part of the first insulator region; at least one conductive plate located on the first insulator region, the at least one conductive plate being located between the gate electrode and the drain region, the at least one conductive plate being in an electrically floating state; a second insulator region located on the first insulator region, the gate electrode, and the at least one conductive plate; source wiring located above the second insulator region, the source wiring electrically connected to the source region; and drain wiring located above the second insulator region, the drain wiring electrically connected to the drain region, wherein in plan view, the source region and the drain region are elongated along a longitudinal direction that is a direction in which facing lengths are longest, and are disposed side by side in a short-side direction that is a direction orthogonal to the longitudinal direction, in plan view, the at least one conductive plate each have a linear region elongated along the longitudinal direction to face each other, and a curved region connecting terminal end portions of the linear regions in the longitudinal direction in a folded line or circular arc shape, in plan view, high voltage wiring of either one of the source wiring and the drain wiring is elongated in the short-side direction to intersect the linear regions of the at least one conductive plate, in plan view, low voltage wiring of the other one of the source wiring and the drain wiring is elongated in the short-side direction to intersect the linear region of the at least one conductive plate, and an interval in a short-side direction between the at least one conductive plate and the gate electrode adjacent to the at least one conductive plate or an interval in a short-side direction between adjacent conductive plates among the at least one conductive plate is shorter than a thickness of the second insulator region.

It is still further possible that a buried insulation film is located between the supporting substrate and the semiconductor layer.

It is still further possible that in plan view, a high voltage side region of either one of the source region and the drain region is completely surrounded by a low voltage side region of the other one of the source region and the drain region, and that in plan view, the high voltage side region is completely surrounded by the at least one conductive plate.

According to the semiconductor device of the present disclosure, breakdown voltage reduction that can occur when the width of the high voltage wiring is increased can be reduced.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS (Findings that form basis of the present disclosure)

The semiconductor device with high a breakdown voltage described in the section on "Description of the Related Art" is mainly for use in a high voltage IC having high voltage wiring with 600 V or more, and as a method for relaxing an electric field by the high voltage wiring, multiple floating field plate (Multiple Floating Field Plate, Abbreviation is MFFP) is disposed under the high voltage wiring, as disclosed in PTL 1 and PTL 2, for example. For device isolation, junction isolation is used.

The present inventor learned that even when the voltage of the high voltage wiring is much lower than 600 V when device isolation using trench isolation from SOI substrate is performed, a breakdown voltage is easily influenced by a wiring voltage so that a breakdown voltage may be reduced depending on a device structure and a temperature condition, and at this time, a breakdown voltage can be increased by using a floating field plate (FFP).

In the present description, a structure having no floating field plate is explained as a first comparative example, and a structure having the floating field plate is described as a second comparative example.

First, the first comparative example will be described hereinafter.

Figure 13:
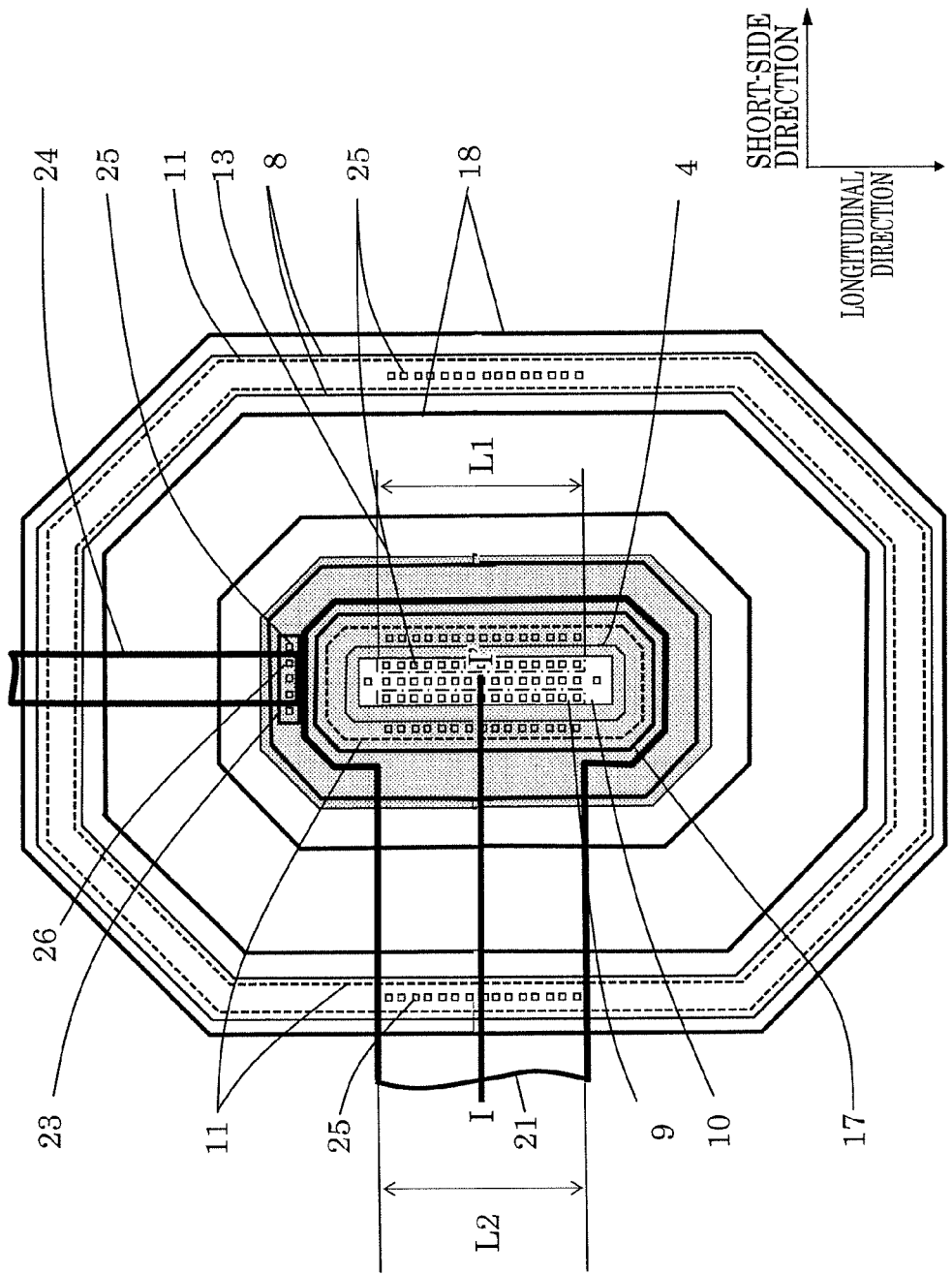
FIG. 13 is a plan view schematically illustrating a semiconductor device according to a first comparative example.

FIG. 13 is a plan view schematically illustrating a semiconductor device according to the first comparative example. Further, FIG. 14 is a schematic sectional view along line I-I' in FIG. 13 in the semiconductor device according to the first comparative example.

Figure 14:
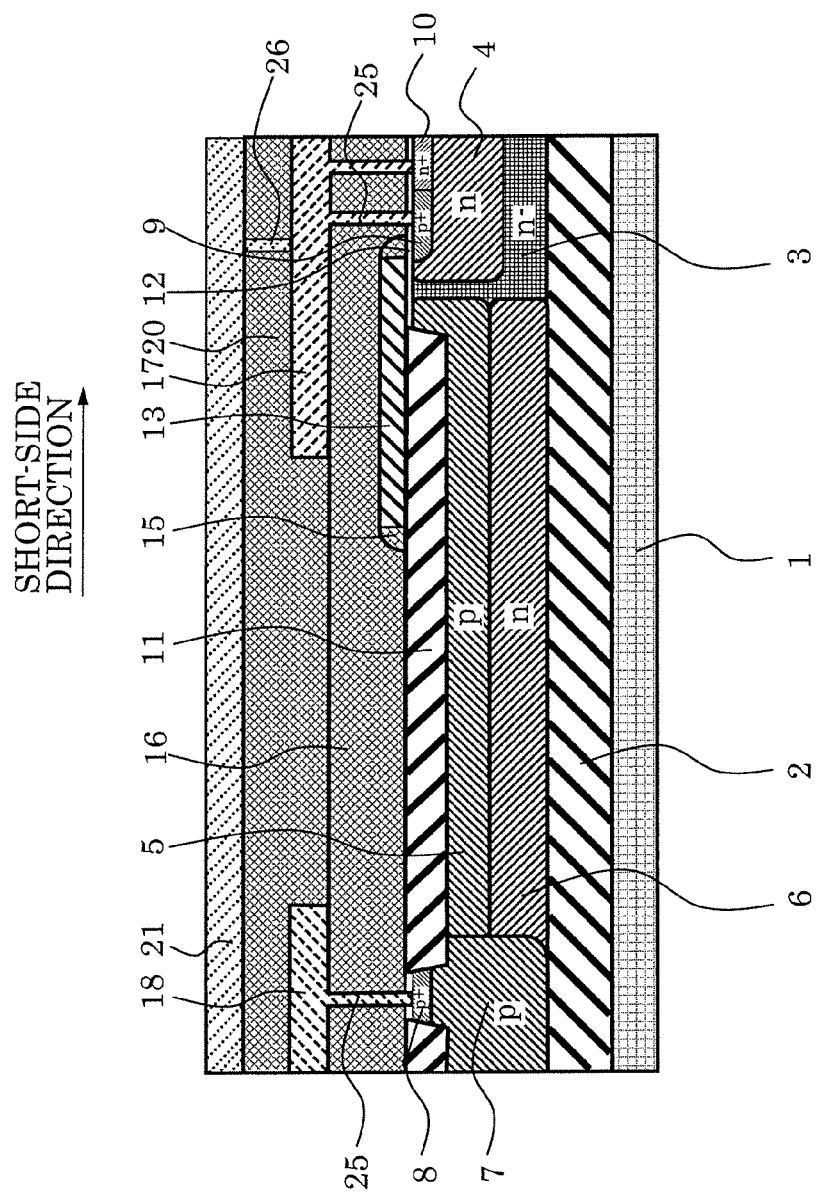
FIG. 14 is a schematic sectional view along line I-I' in FIG. 13 in the semiconductor device according to the first comparative example.

FIG. 14 shows a sectional view of a lateral P-channel MOS transistor as the semiconductor device.

Note that in the present description, a lateral P-channel MOS transistor is cited as an example, but the semiconductor device is similarly realized in a case of a lateral N-channel MOS transistor when conductivity types of the respective components are changed.

As illustrated in FIG. 14, in a lateral P-channel MOS transistor, an SOI substrate formed by bonding buried insulation film 2 and low concentration n− type semiconductor layer 3 on supporting substrate 1 is used. In upper portions of low concentration n− type semiconductor layer 3 on the SOI substrate, n type body region 4, p type drift region 5, n type buried region 6, and p type drain region 7 are located. On p type drain region 7, high concentration p+ type drain region 8 is located. Further, on n type body region 4, high concentration p+ type source region 9 and high concentration n+ type body/contact region 10 are located.

Further, between n type body region 4 that is a part of a surface side in low concentration n− type semiconductor layer 3, and high concentration p+ type drain region 8, STI (Shallow Trench Isolation) region 11 formed of a thick insulation film that is a first insulator region is located. Further, thin gate insulation film 12 is laid to extend from n type body region 4 that is another part of the surface side of low concentration n− type semiconductor layer 3 to a part of p type drift region 5.

Gate electrode 13 is elongated from a top of gate insulation film 12 to a part on STI region 11. On a side wall of gate electrode 13, side wall spacer 15 is located.

Second insulation film 16 that is a second insulator region is located to cover gate electrode 13. Above high concentration p+ type source region 9 and above high concentration n+ type body/contact region 10, source electrode 17 that electrically connects to source region 9 and body/contact region 10 via contacts 25 that penetrate through second insulation film 16 is located.

Further, above high concentration p+ type drain region 8, drain electrode 18 that electrically connects to drain region 8 via contact 25 that penetrates through second insulation film 16 is located. On source electrode 17 and drain electrode 18, third insulation film 20 that is a third insulator region is located. Further, source wiring 21 that electrically connects to source electrode 17 through via 26 that penetrates through third insulation film 20 is located.

Plane layout of high breakdown voltage lateral P channel MOS transistor will be described hereinafter.

In general, in a high breakdown voltage MOS transistor, a high voltage is applied to either one of a drain region and a source region, and a low voltage is applied to the other one. As the plane layout, a high voltage region of either one of the drain region or the source region is often surrounded by a low voltage region of the other one, so that wiring that is led out from the high voltage region has a constant width, and crosses over the low voltage region to be led to an outside of the device.

In a P channel type, a high voltage is normally applied to the source region rather than the drain region, so that there may be a case where the source region and the body region are surrounded by the drain region, and wiring from the source region is led out as high voltage wiring. The case will be described hereinafter.

Note that in an N channel type, a high voltage is normally applied to the drain region rather than the source region, so that layout of the drain region and the source region is often opposite from layout in the above described P channel type.

In FIG. 13, p type drift region 5, n type buried region 6, and p-type drain region 7 are not shown to make the drawing easy to understand.

In FIG. 13, n type body region 4 shows a rectangular shape that is elongated to be long in a longitudinal direction, and has four corners chamfered. Inside n type body region 4, high concentration p+ type source region 9 and high-concentration n+ type body/contact region 10 are disposed adjacently to each other. STI region 11 is disposed in a ring shape at an interval from n type body region 4 in such a manner as to surround a periphery of n type body region 4. Further, outside of STI region 11, high concentration p+ type drain region 8 is disposed in a ring shape.

Inside a ring-shaped planar shape of STI region 11, gate insulation film 12 is located, and gate electrode 13 is disposed to surround a top of high concentration p+ type source region 9, and high concentration n+ type body/contact region 10. Gate electrode 13 electrically connects to first gate wiring 23 through contact 25, and further electrically connects to second gate wiring 24 through via 26. Second gate wiring 24 is led out across a top of drain electrode 18.

p+ type source region 9 and p+ type drain region 8 are elongated along a longitudinal direction which is a direction in which a length with which p+ type source region 9 and p+ type drain region 8 are disposed to face each other is longest, and are disposed side by side in a short-side direction that is a direction orthogonal to the longitudinal direction. In FIG. 13, the length with which p+ type source region 9 and p+ type drain region 8 face each other corresponds to width L1 in the longitudinal direction of p+ type source region 9.

When the transistor operates, a current mainly flows in the short-side direction within this range. Therefore, when a current ability of the transistor is desired to be increased, width L1 in the longitudinal direction of p+ type source region 9 is enlarged. High voltage wiring of source wiring 21 is elongated to the short-side direction across the top of p+ type drain region 8.

Next, a second comparative example will be described hereinafter.

Figure 15:
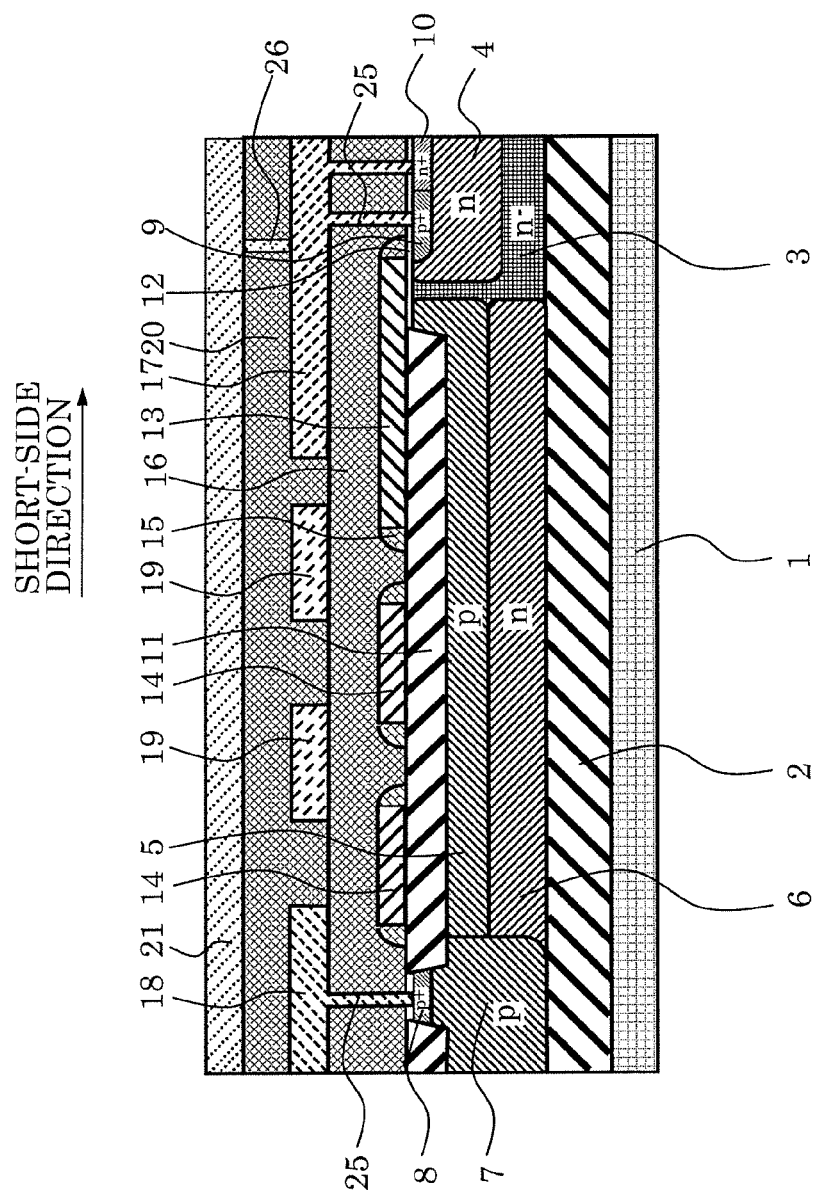
FIG. 15 is a schematic sectional view along line II-II' in FIG. 16 in the semiconductor device according to the second comparative example.
Figure 16:
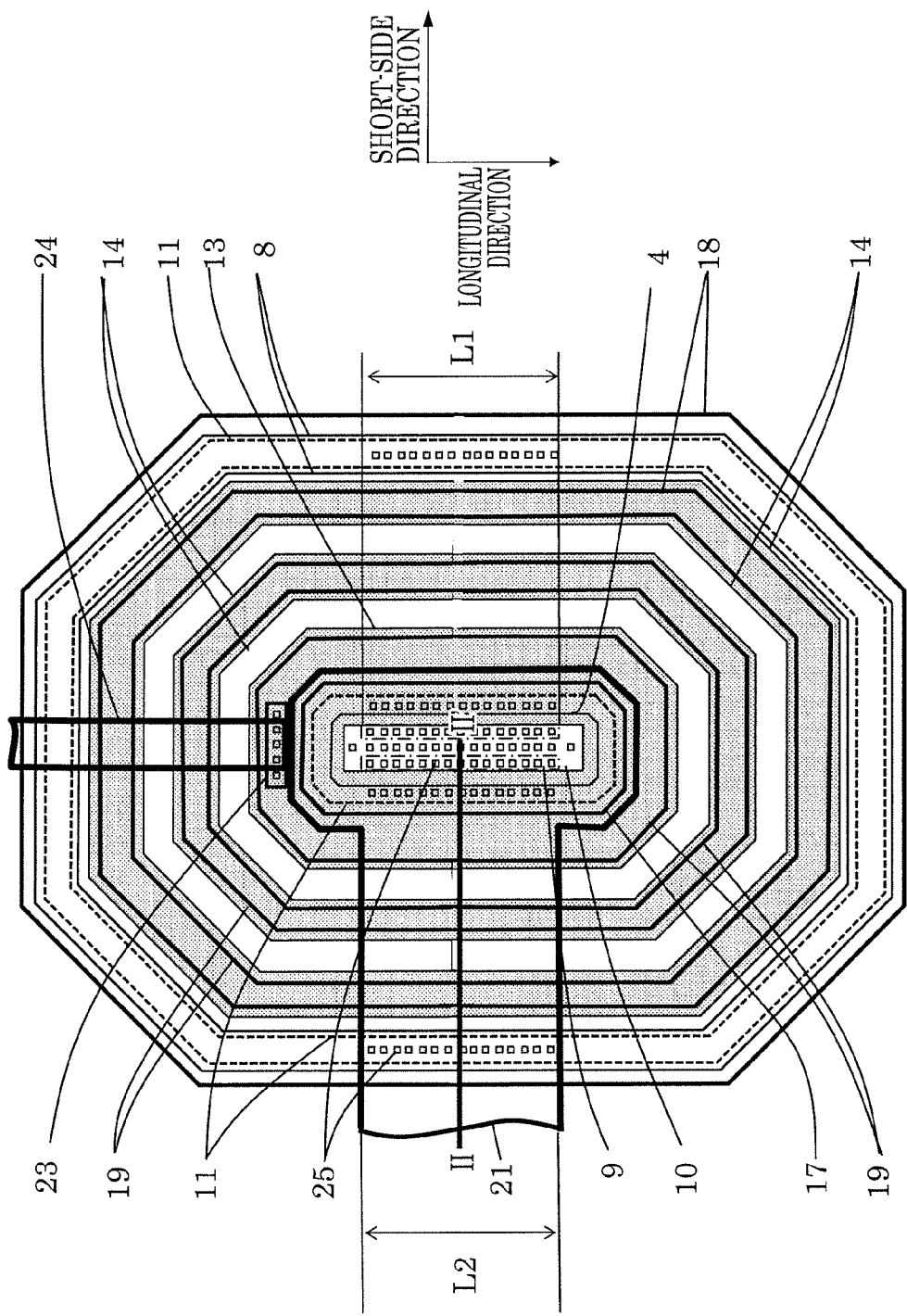
FIG. 16 is a plan view schematically illustrating a semiconductor device according to the second comparative example.

FIG. 15 shows a sectional view of a typical lateral P-channel MOS transistor that is located on an SOI substrate including a floating field plate, and FIG. 16 shows a plan view of the lateral P-channel MOS transistor. FIG. 15 is a sectional view in II-IP line in FIG. 16.

In FIG. 15, as compared with FIG. 13 described above, at least one first floating field plate 14 that is a conductive plate which is located between gate electrode 13 and p+ drain region 8 on STI region 11, and is in an electrically floating state, and at least one second floating field plate 19 that is a conductive plate which is located on a top part where gate electrode 13 and first floating field plate 14 are not located, on second insulation film 16, and is in an electrically floating state are located.

In plan view of FIG. 16, each of field plates of first floating field plate 14 and second floating field plate 19 has linear regions that face each other along a longitudinal direction, and curved regions that continue in a folded line (or a circular arc) shape that curves at vertexes of obtuse angles in terminal ends of linear portions in the longitudinal direction, and high voltage wiring of source wiring 21 is elongated to a short-side direction to intersect the linear regions of first floating field plate 14 and second floating field plate 19.

A difference in breakdown voltage characteristic between the first comparative example and the second comparative example will be described.

Figure 17:
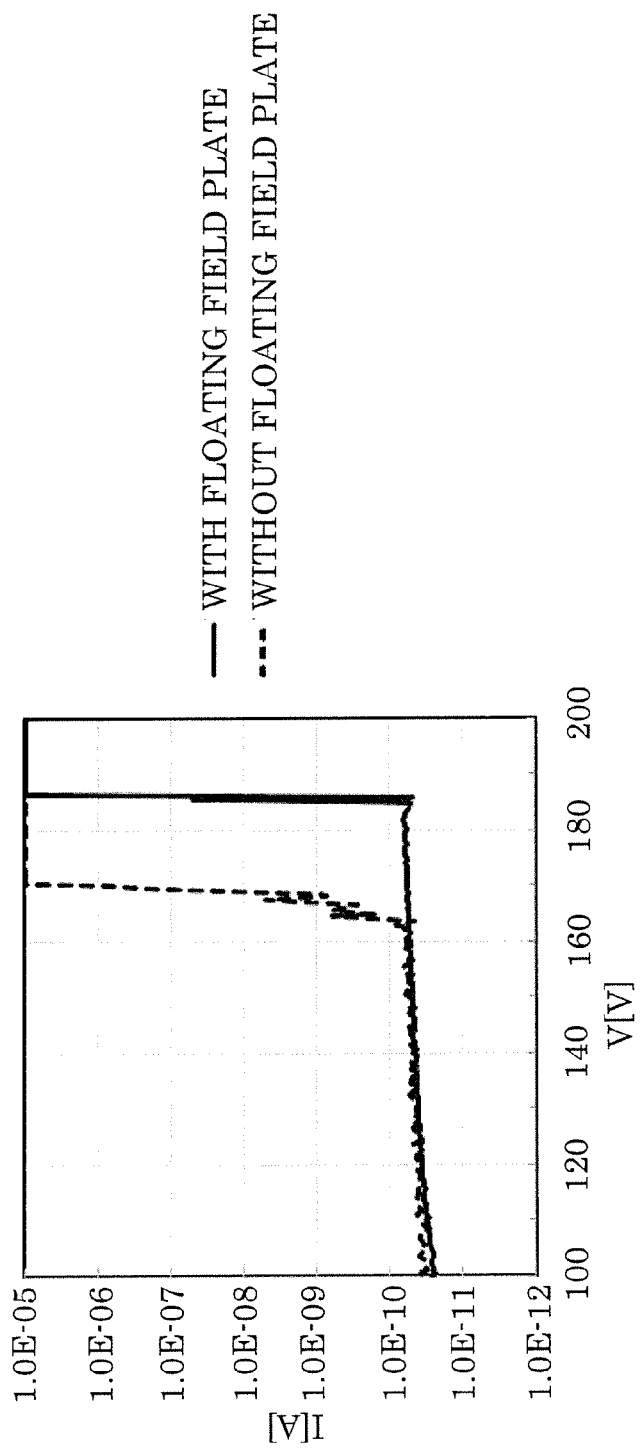
FIG. 17 is a current-voltage characteristic chart comparing breakdown voltage characteristics of the first comparative example and the second comparative example.

FIG. 17 shows comparison of the breakdown voltage characteristics of the first comparative example and the second comparative example. As is obvious from FIG. 17, a breakdown voltage increases by disposing the multiple floating field plates under the high voltage wiring.

However, when the floating field plate is used, a problem as described as follows can arise.

Each of the floating field plates capacitively couples conductors and charges that exist nearby via the insulation film, so that a potential of the floating field plate may vary according to a proportion of a capacity ratio to the objects to be capacitively coupled to influence the resistance voltage.

Figure 18:
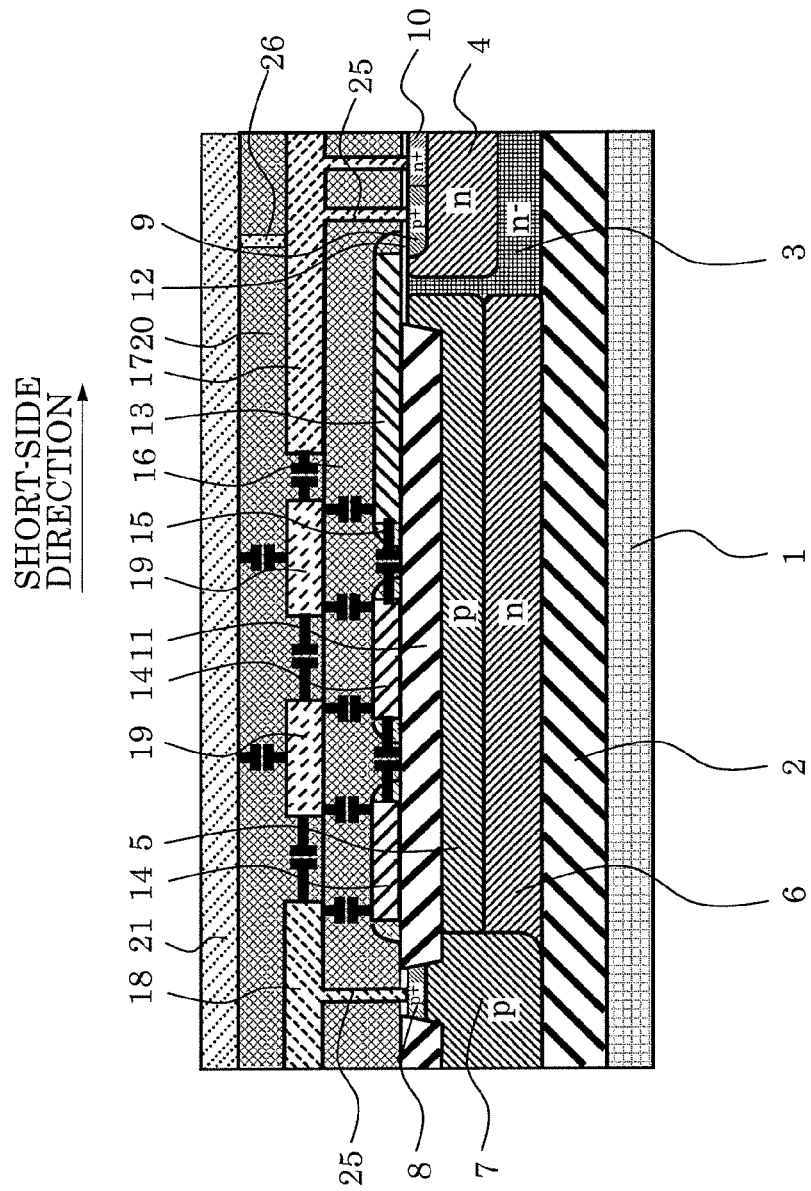
FIG. 18 illustrates capacitive coupling of a floating field plate in the semiconductor device according to the second comparative example.

FIG. 18 illustrates capacitive coupling of each of the floating field plates illustrated in FIG. 15. In FIG. 18, the objects are high voltage wiring, a semiconductor layer surface, and an adjacent floating field plate as the conductors, and are charges in an Si/SiO2 interface and an insulation film as the charges. When the semiconductor device is assembled into package, it is necessary to also consider mobile ions in a sealing material located above.

The potential of the floating field plate is drawn to the potential of an object with large capacitive coupling. A capacity depends on an area facing an object as a design layout element, when a sectional structure (mainly, a film thickness of the insulation film, a dielectric constant) is determined. Accordingly, when the area with which the high voltage wiring and the floating field plate face each other increases, the potential of the floating field plate increases and is saturated. The facing area depends on a width with which the high voltage wiring is led out when the high voltage wiring and the floating field plate are orthogonal to each other.

When a current ability of the transistor is enhanced, a width in the longitudinal direction of the source region is enlarged, and in that case, a width in the longitudinal direction of the lead-out wiring is also enlarged, typically.

However, depending on the device structure and temperature condition, enlargement of the width in the longitudinal direction of the high voltage wiring may increase the potential of the floating field plate for the above described reason, and may narrow an interval of equipotential lines from an electrode at a low potential side of either the drain or the source to increase an electric field to reduce a breakdown voltage.

Figure 19:
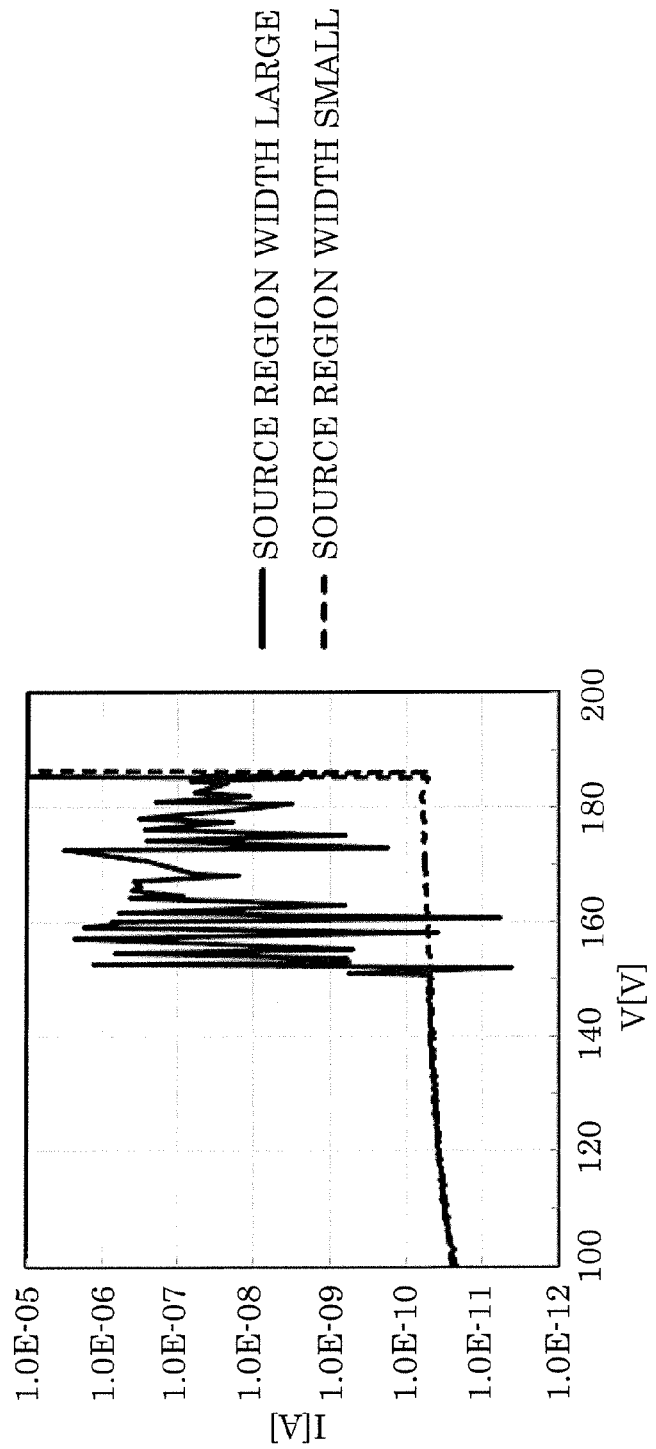
FIG. 19 shows a current-voltage characteristic chart comparing a size of a width in a longitudinal direction of a source region in a breakdown voltage of the semiconductor device according to the second comparative example

FIG. 19 shows a current-voltage characteristic in that the breakdown voltage between the drain and source is reduced due to layout in which the width in the longitudinal direction of the source region is enlarged, in the high breakdown voltage P-channel MOS transistor illustrated in FIG. 16. As a cause of this phenomenon, an increase in floating field plate potential due to increase in coupling capacity between the floating field plate and the high voltage wiring is considered.

In the light of the problem as above, the present disclosure provides a semiconductor device with a high breakdown voltage that can decrease resistance voltage reduction that can occur when the width of the high voltage wiring is enlarged.

Hereinafter, embodiments will be described with reference to the drawings. However, in order to avoid explanation from being unnecessarily redundant and make understanding of a person skilled in the art easy, detailed explanation may be omitted with respect to, for example, detailed explanation of the matters already well known, redundant explanation on substantially the same components, and the like.

Note that the accompanying drawings and the following explanation present only examples for a person skilled in the art to understand the present disclosure sufficiently, and do not limit the subject matter described in the claims.

Embodiment 1

Figure 1:
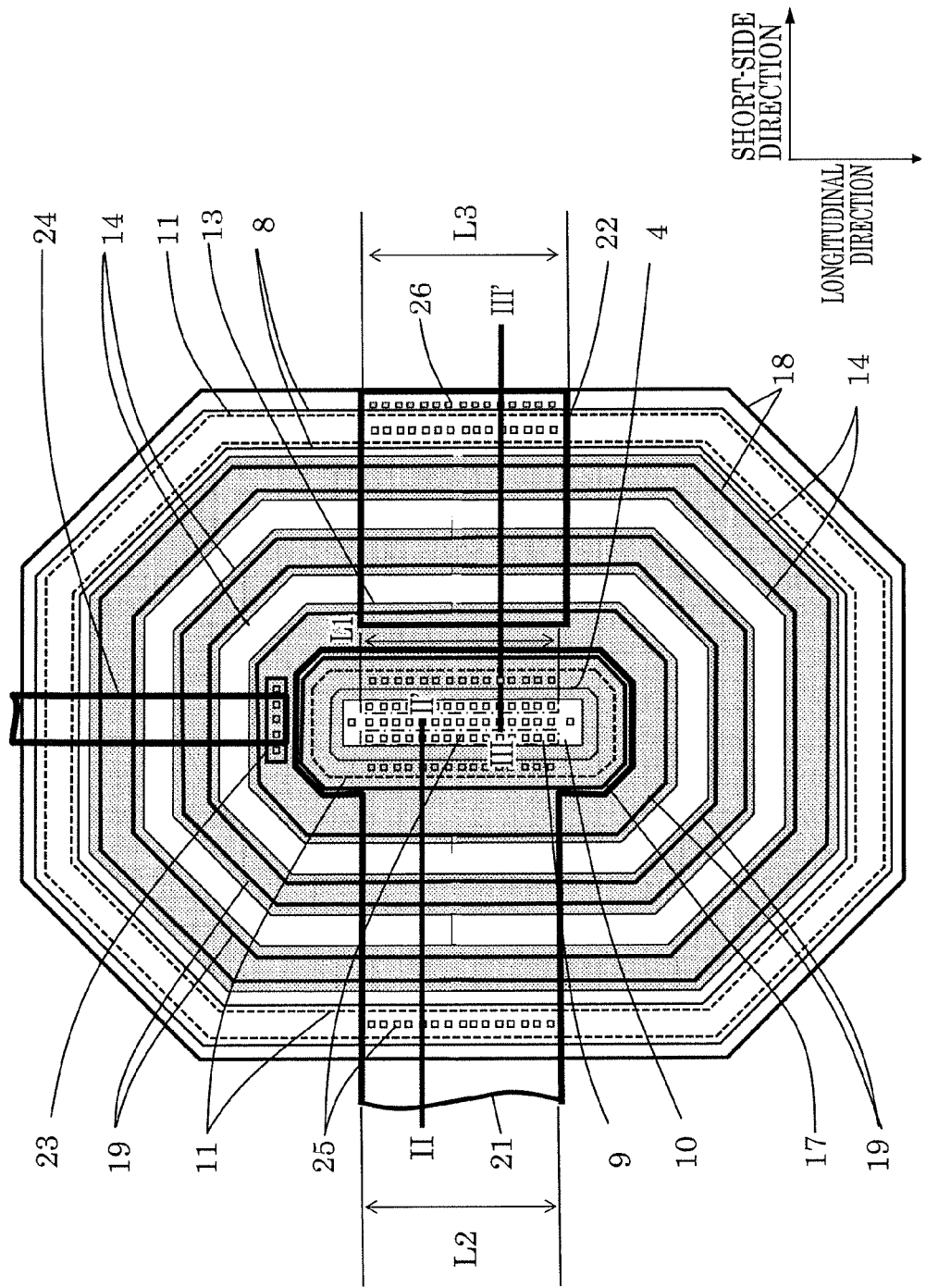
FIG. 1 is a plan view schematically illustrating a semiconductor device according to Embodiment 1.
Figure 2:
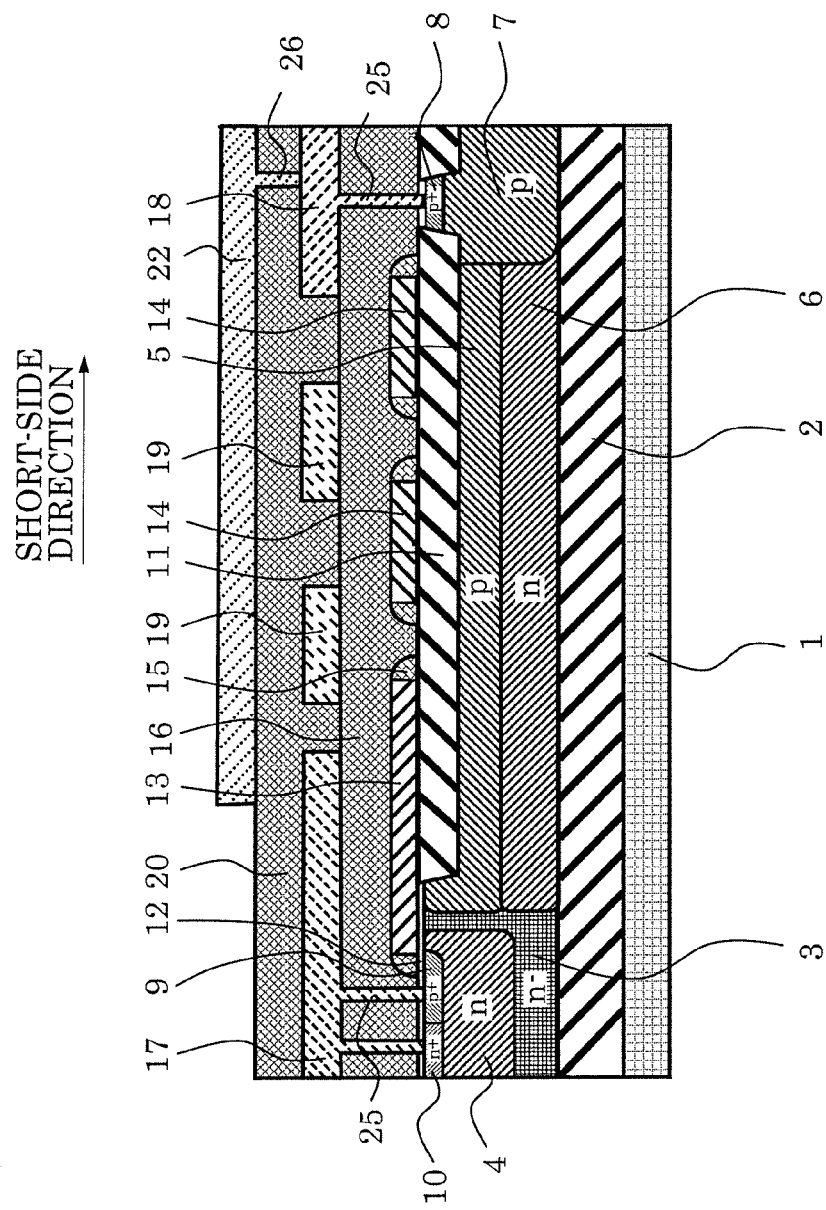
FIG. 2 is a schematic sectional view along line III-III' in FIG. 1 regarding the semiconductor device according to Embodiment 1.

Concerning a semiconductor device according to Embodiment 1, a plan view of a lateral P-channel MOS transistor is shown in FIG. 1 as an example, and a sectional view along line III-III' in FIG. 1 is shown in FIG. 2. Note that in FIG. 1, a sectional view along line II-II' is the same as FIG. 15 of the second comparative example.

As for FIG. 1, layout is such that p+ type source region 9 and n type body region 4 are surrounded by p+ type drain region 8 similarly to FIG. 16 which is a plan view of the second comparative example, and p+ type source region 9 and p+ type drain region 8 are elongated along a longitudinal direction that is a direction in which a length with which source region 9 and drain region 8 face each other is longest, and are disposed side by side in a short-side direction that is a direction orthogonal to the longitudinal direction.

Two-layer field plates that are first floating field plate 14 and second floating field plate 19 each have a linear region that face each other along the longitudinal direction, and curved regions that continue in a folded line (or circular arc) shape that curves at vertexes of obtuse angles in the terminal ends of the linear portions in the longitudinal direction, high voltage wiring of source wiring 21 is elongated to the short-side direction to intersect the linear regions of first floating field plate 14 and second floating field plate 19.

A higher voltage is applied to p+ type source region 9 than to p+ type drain region 8. Source wiring 21 that is led out from p+ type source region 9 is led to outside of a device across a top of p+ type drain region 8 of the low voltage region.

In order to enhance a current ability of a transistor, width L1 in the longitudinal direction of p+ type source region 9 is enlarged. At the same time as this, width L2 in the longitudinal direction of source wiring 21 is also enlarged. A ratio of capacity between each of the floating field plates and source wiring 21 which is high voltage wiring to a total capacity of each of the floating field plates increases and is saturated as width L2 in the longitudinal direction of source wiring 21 is enlarged. This is considered to be the same thing as the fact that a ratio of an area with which source wiring 21 covers each of the floating field plates and a total area of each of the floating field plates increases and is saturated as width L2 in the longitudinal direction of source wiring 21 is enlarged.

Accordingly, a potential of each of the floating field plates that is drawn to a potential of an object with which capacitive coupling increases is considered to rise with enlargement of width L2 in the longitudinal direction of source wiring 21 which is high voltage wiring.

Hereinafter, a difference between the present embodiment and the second comparative example will be described in detail.

In the present embodiment, drain wiring 22 that is low voltage wiring is elongated with width L3 in the longitudinal direction that is substantially the same as source wiring 21, toward gate electrode 13 in the short-side direction. Drain wiring 22 covers tops of first floating field plate 14 and second floating field plate 19 so as to intersect all the linear regions in the longitudinal direction of first floating field plate 14 and second floating field plate 19, as is also understandable from FIG. 2 which is a sectional view along line III-III' in FIG. 1. As a result, first floating field plate 14 and second floating field plate 19 are capacitively coupled with drain wiring 22 which is low voltage wiring.

In the second comparative example, only capacitive coupling with source wiring 21 of high voltage wiring is adopted, but in the present embodiment, capacitive coupling with the low voltage wiring also can be combined. Accordingly, control of the potentials of the floating field plates becomes easy.

As described above, magnitude of capacitive coupling is proportional to facing areas, so that in the linear region, capacitive coupling can be adjusted by the width in the longitudinal direction. It becomes possible to adjust potentials of the respective floating field plates by a capacity that is determined by the widths in the longitudinal direction of source wiring 21 which is high voltage wiring and drain wiring 22 which is low voltage wiring respectively intersecting first floating field plate 14 and second floating field plate 19.

When a depletion layer reaches a low voltage side region and thereby an electric field concentrates to cause breakdown near the low voltage side region, in the P-channel type high breakdown voltage MOS transistor, the potential of the floating field plates is adjusted to be low, and capacitive coupling with the low voltage wiring is increased to suppress spread of the depletion layer. On the other hand, when an electric field concentrates to cause breakdown in the high voltage side region, the potential of the floating field plates is adjusted to be high, and capacitive coupling with the low voltage wiring is decreased to promote spread of the depletion layer.

The present embodiment is characterized in that by adjusting the widths in the longitudinal direction of the high voltage wiring and the low voltage wiring which are located above the linear regions of the floating field plates in this way, spread of the depletion layer is adjusted to stabilize a breakdown voltage.

Figure 3:
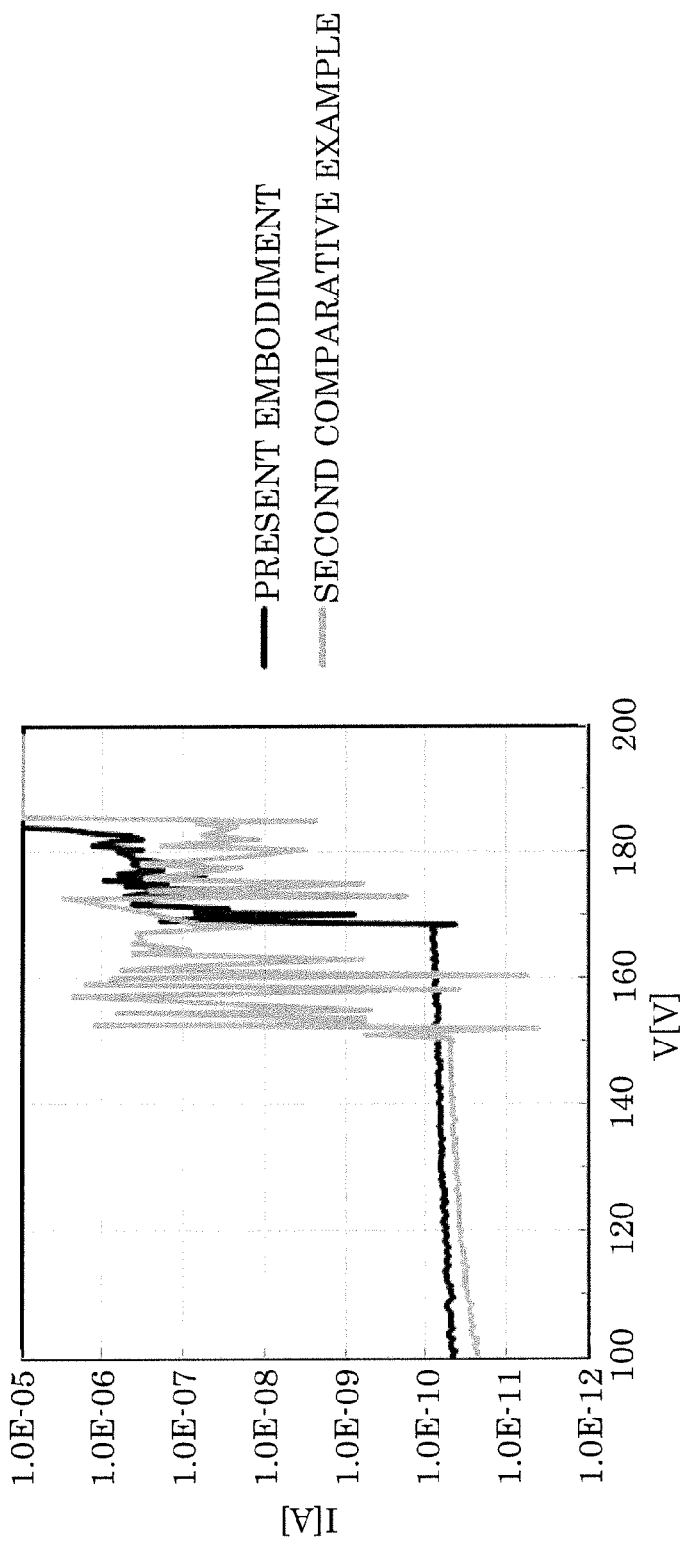
FIG. 3 is a current-voltage characteristic chart comparing breakdown voltage characteristics of the semiconductor device according to Embodiment 1 and the second comparative example.

FIG. 3 is a current-voltage characteristic chart comparing breakdown voltage characteristics of the present embodiment and the second comparative example, when the width in the longitudinal direction of p+ type source region 9 is enlarged in the high breakdown voltage P-channel MOS transistor. According to the configuration of the present embodiment, the breakdown voltage is improved as compared with the second comparative example.

Figure 4:
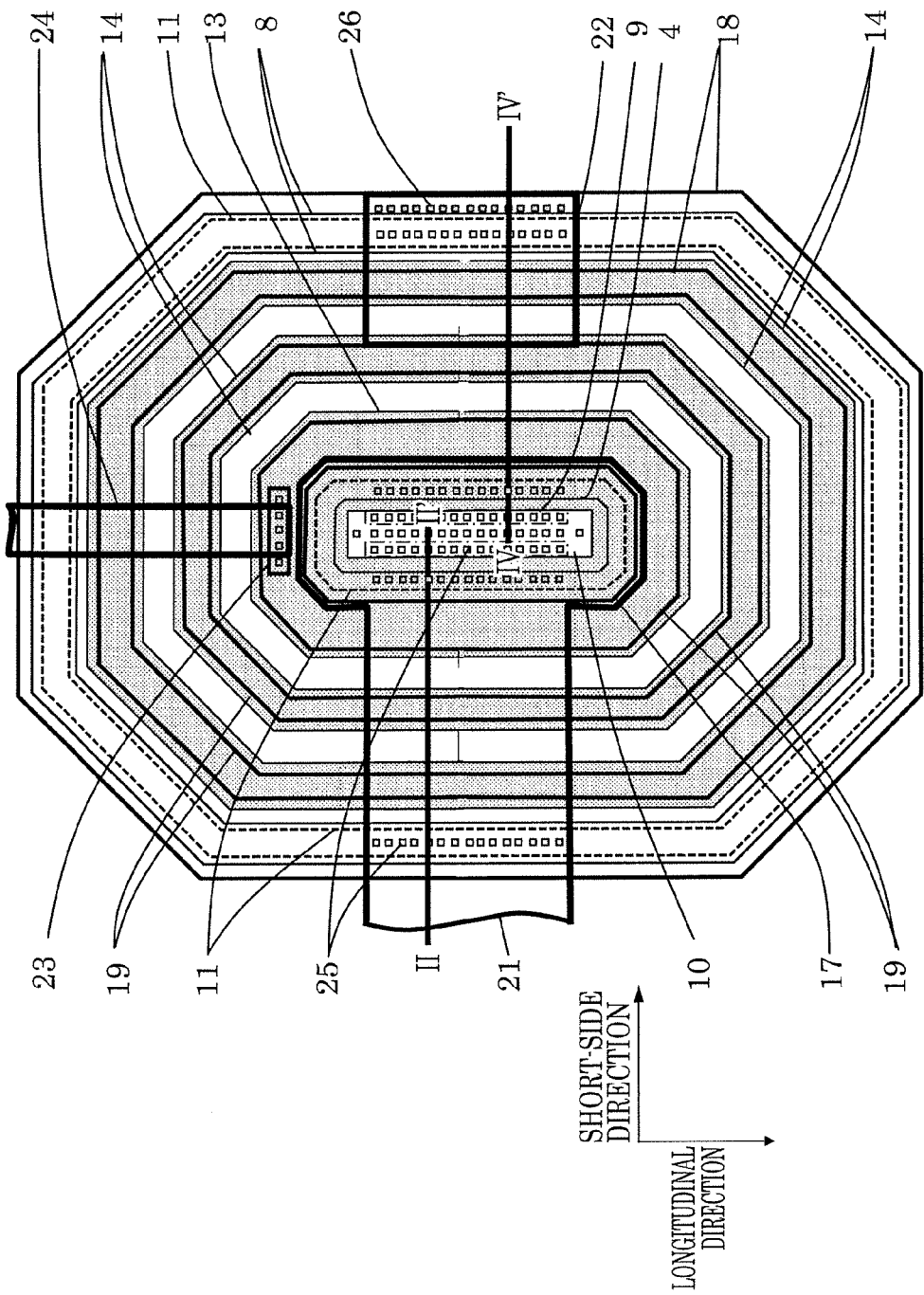
FIG. 4 is a plan view schematically illustrating a modified example of the semiconductor device according to Embodiment 1.
Figure 5:
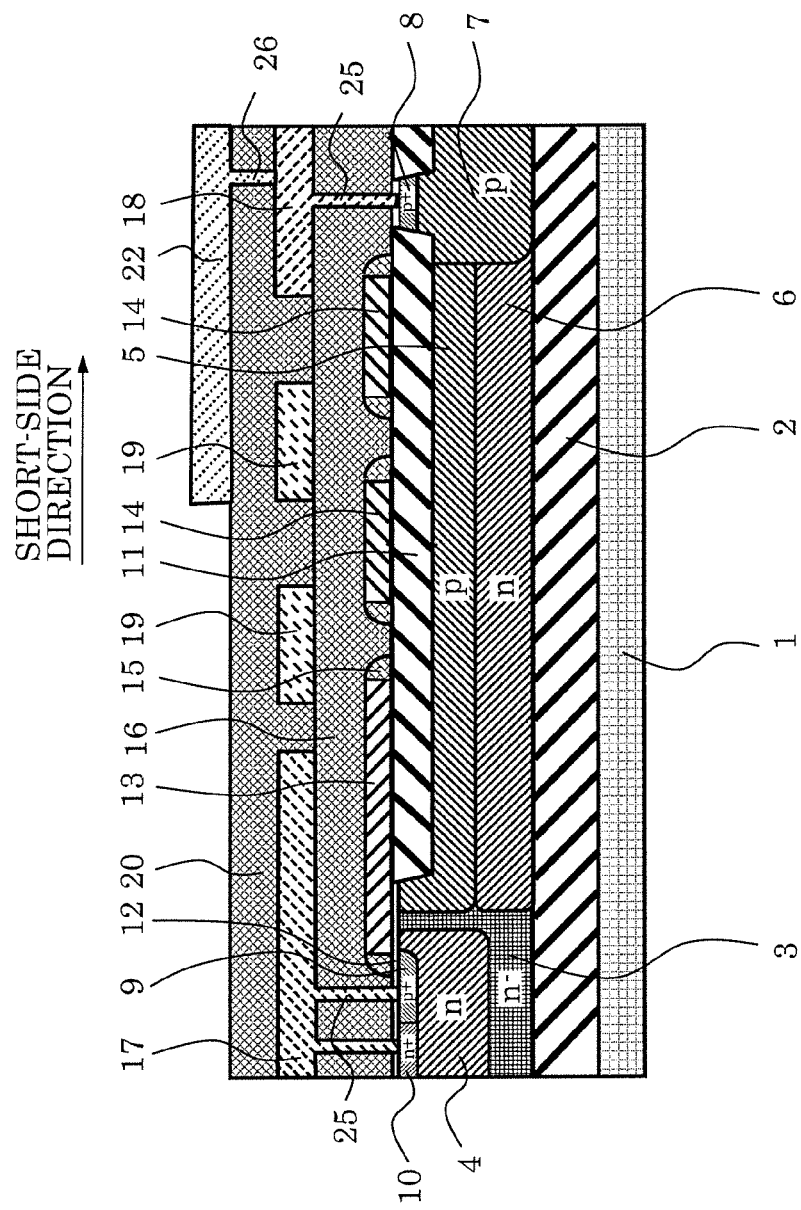
FIG. 5 is a schematic sectional view along line IV-IV' in FIG. 4 regarding the modified example of the semiconductor device according to Embodiment 1.

Further, FIG. 4 is a plan view illustrating a modified example of the present embodiment, and FIG. 5 is a sectional view along line IV-IV' in FIG. 4. FIGS. 4 and 5 each shows a case where in a structure having a plurality of first floating field plates 14 and a plurality of second floating field plates 19, drain wiring 22 is disposed only above one of each of the plurality of first floating field plates 14 and the plurality of second floating field plates 19 at the low voltage side, and in this case, the breakdown voltage can be also expected to be improved.

In this way, in the present embodiment, drain wiring 22 is elongated to above the linear region in the longitudinal direction of at least one floating field plate, and thereby exhibits an effect of improving a breakdown voltage.

As described above, the feature of the present embodiment lies in that the linear region in the longitudinal direction of the floating field plate intersects both the low voltage wiring and the high voltage wiring. When the width in the longitudinal direction of the source region is enlarged, the widths in the longitudinal direction of the low voltage wiring and the high voltage wiring that are led out from the drain region or the source region are also enlarged simultaneously. The ratio of capacitive coupling of the floating field plate and the low voltage wiring or the high voltage wiring determines the potential of the floating field plate, so that in order to perform device design with the ratio made highly precise, the low voltage wiring or the high voltage wiring may orthogonally intersect the floating field plate in the linear region.

As described above, the semiconductor device according to Embodiment 1 includes: semiconductor layer 3 located on a principal surface of supporting substrate 1; body region 4 located in an upper portion of semiconductor layer 3, body region 4 having a first conductivity type; drain region 8 located in an upper portion of semiconductor layer 3, drain region 8 having a second conductivity type, drain region 8 being apart from body region 4; source region 9 located in an upper portion of body region 4, source region 9 having the second conductivity type; drift region 5 located between drain region 8 and body region 4 in semiconductor layer 3, drift region 5 having the second conductivity type; first insulator region 11 (STI region 11) located in an upper portion of semiconductor layer 3, first insulator region 11 being located between body region 4 and drain regions 7, 8, first insulator region 11 overlapping drift region 5; gate insulation film 12 located on semiconductor layer 3, the gate insulation film being located from a part on body region 4 to an end portion of first insulator region; gate electrode 13 located on at least part of the gate insulation film and at least part of first insulator region 11; at least one first conductive plate (first floating field plate 14) located on first insulator region 11, the at least one first conductive plate being located between gate electrode 13 and drain region 8, the at least one first conductive plate being in an electrically floating state; a second insulator region (second insulation film 16) located on first insulator region 11, gate electrode 13, and the at least one first conductive plate; at least one second conductive plate (second floating field plate 19) located on the second insulator region where at least gate electrode 13 and the at least one first conductive plate are not located, the at least one second conductive plate being in an electrically floating state; a third insulator region (third insulation film 20) located on the second insulator region, above gate electrode 13 and on the at least one second conductive plate; source wiring 21 located above the third insulator region, source wiring 21 electrically connected to source region 9; and drain wiring 22 located above the third insulator region, drain wiring 22 electrically connected to drain region 8. In plan view, source region 9 and drain region 8 are elongated along a longitudinal direction that is a direction in which facing lengths are longest, and are disposed side by side in a short-side direction that is a direction orthogonal to the longitudinal direction. In plan view, the at least one first conductive plate and the at least one second conductive plate each have a linear region elongated along the longitudinal direction to face each other, and a curved region connecting terminal end portions of the linear regions in the longitudinal direction in a folded line or circular arc shape. In plan view, high voltage wiring of either one of source wiring 21 and drain wiring 22 is elongated in the short-side direction to intersect the linear regions of the at least one first conductive plate and the at least one second conductive plate. In plan view, low voltage wiring of the other one of source wiring 21 and drain wiring 22 is elongated in the short-side direction to intersect at least one of (i) the linear region of the at least one first conductive plate and (ii) the linear region of the one second conductive plate. Note that the first conductivity type means one of a P-type and an N-type, and the second conductivity type means the other one of the P-type and the N-type.

According to this, breakdown voltage reduction that can occur when the width of the high voltage wiring is enlarged can be decreased. Explaining in more detail, the first conductive plate and the second conductive plate are capacitively coupled with low voltage wiring 22 that is elongated to intersect the linear region. Capacitive coupling with the high voltage wiring, and capacitive coupling with the low voltage wiring can be combined. Accordingly, control of the potentials of the first and second conductive plates becomes easy. In other words, the magnitude of capacitive coupling is proportional to the facing area, so that in the linear region, capacitive coupling can be adjusted with the width in the longitudinal direction. It becomes possible to adjust the potentials of the respective conductive plates by the capacity that is determined by the width in the longitudinal direction with which each of high voltage wiring and the low voltage wiring intersecting the first conductive plate and the second conductive plate. Thereby, it is made possible to decrease breakdown voltage reduction.

Here, it is possible that buried insulation film 2 is located between supporting substrate 1 and semiconductor layer 3.

It is also possible that in plan view, a high voltage side region of either one of source region 9 and drain region 8 is completely surrounded by a low voltage side region of the other one of source region 9 and drain region 8, and that in plan view, the high voltage side region is completely surrounded by the at least one first conductive plate and the at least one second conductive plate.

It is further possible that in plan view, the low voltage wiring intersects the linear region of each of the at least one first conductive plate and the linear region of each of the at least one second conductive plate.

Embodiment 2

Figure 6:
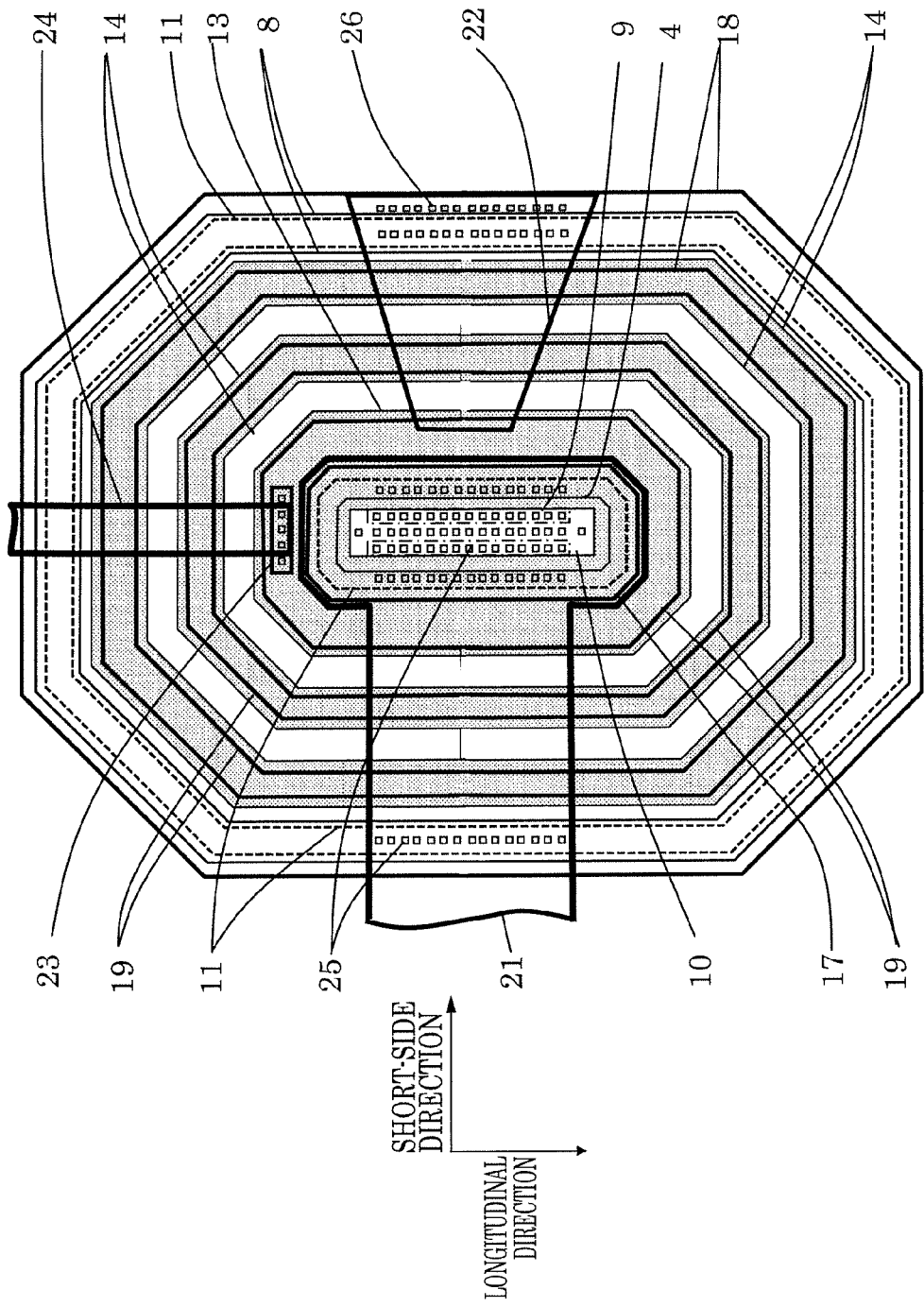
FIG. 6 is a plan view schematically illustrating a semiconductor device according to Embodiment 2.

Concerning a semiconductor device according to Embodiment 2, a plan view of a lateral P-channel MOS transistor is shown in FIG. 6, as an example.

Unlike the shape of drain wiring 22 of Embodiment 1 shown in FIG. 1, in the present embodiment, the width in the longitudinal direction of drain wiring 22 becomes narrower in the short-side direction toward source region 9, as shown in FIG. 6.

The configuration exhibits an effect of raising potentials of the floating field plates at the high voltage side by weakening capacitive coupling of drain wiring 22 with first floating field plate 14 and second floating field plate 19 toward source region 9 at the high voltage side. In particular, when a depletion layer reaches drain region 8 at the low voltage side and an electric field concentrates, an effect can be expected in improving a breakdown voltage.

In contrast with the above, there can be a case where the width in the longitudinal direction of drain wiring 22 is enlarged toward source region 9 in the short-side direction, though not illustrated.

The configuration has an effect of lowering the potentials of the floating field plates at the high voltage side by strengthening capacitive coupling of drain wiring 22 with first floating field plate 14 and second floating field plate 19 toward source region 9 at the high voltage side. An effect can be expected in improving a breakdown voltage when an electric field concentrates in a vicinity of source region 9 at the high voltage side.

In reality, it depends on an impurity concentration of drift region 5 and a space between source region 9 and drain region 8 whether the electric field concentrates in the vicinity of source region 9 at the high voltage side or drain region 8 at the low voltage side. Therefore, it is considered as possible to improve a breakdown voltage by adjusting capacitive coupling by changing the width in the longitudinal direction of wiring elongated to the short-side direction at each time.

As described above, in the semiconductor device according to Embodiment 2, in plan view, a width in the longitudinal direction where the linear region of the at least one first conductive plate (first floating field plate 14) and the linear region of the at least one second conductive plate (second floating field plate 19) overlap the low voltage wiring is reducing or increasing toward a high voltage side region of either one of drain region 8 and source region 9.

According to the above, it is conceivable that the effect of lowering (or raising) the potential of the conductive plate at the high voltage side is provided by strengthening (or weakening) capacitive coupling of the low voltage wiring with the first conductive plate and the second conductive plate toward the high voltage region, and electric field concentration can be relaxed even a little by adjusting spread of the depletion layer.

Embodiment 3

Figure 7:
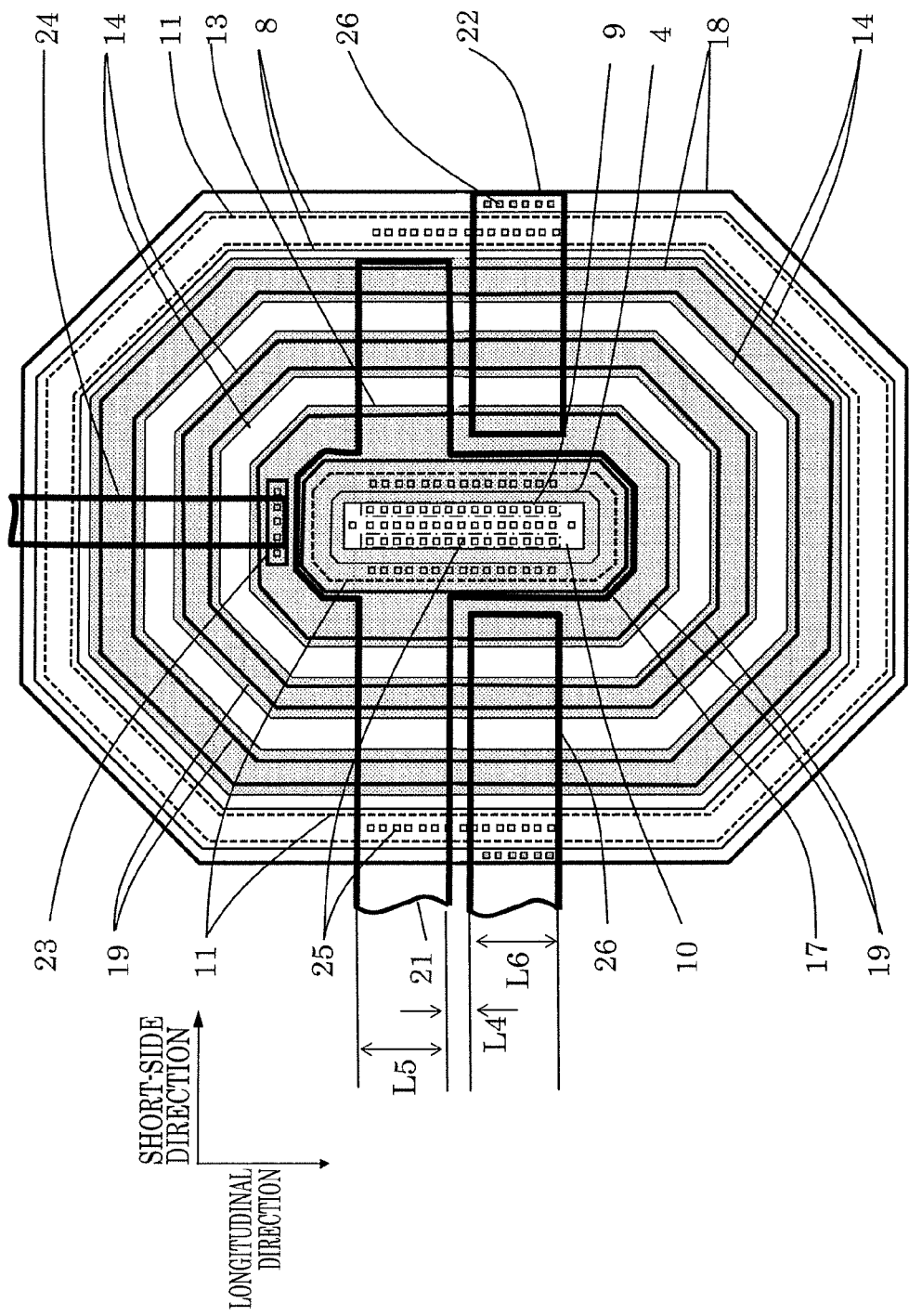
FIG. 7 is a plan view schematically illustrating a semiconductor device according to Embodiment 3.

Concerning a semiconductor device according to Embodiment 3, a plan view of a lateral P-channel MOS transistor is shown in FIG. 7 as an example.

Unlike the disposition of drain wiring 22 and source wiring 21 of Embodiment 1 shown in FIG. 1, in the present embodiment, drain wiring 22 and source wiring 21 are both located symmetrically in the short-side direction with p+ type source region 9 as a center, as shown in FIG. 7.

Hereinafter, an effect of the above will be described. The potentials of first floating field plate 14 and second floating field plate 19 are considered to converge onto potentials obtained by dividing an applied voltage by capacitive coupling finally when the potentials of drain wiring 22 and source wiring 21 change.

However, even when a polycrystalline polysilicon doped with impurities with high concentration, for example, is used as first floating field plate 14, the resistance rate is higher as compared with ordinary metal wiring. When a conductor of the material like this is used, voltage reduction is considered to occur by a current that transitionally flows in a very short time period until the voltage converges. In that case, it is feared that the potential temporarily varies and is brought into an unstable state. In order to decrease the time period required for the variation, it is considered to be favorable to cause drain wiring 22 and source wiring 21 approach each other as much as possible.

Therefore, in the present embodiment in which drain wiring 22 and source wiring 21 are elongated in parallel in the short-side direction, space L4 in the longitudinal direction between drain wiring 22 and source wiring 21 is made narrower than width L5 in the longitudinal direction of drain wiring 22 and width L6 in the longitudinal direction of source wiring 21.

As described above, in the semiconductor device according to Embodiment 3, in plan view, source wiring 21 and drain wiring 22 that intersect the linear region of the at least one first conductive plate (first floating field plate 14), and the linear region of the at least one second conductive plate (second floating field plate 19) are elongated side by side in the longitudinal direction, and a space in the longitudinal direction between source wiring 21 and drain wiring 22 is narrower than widths in the longitudinal direction of source wiring 21 and drain wiring 22.

It is considered that this leads to stabilization of a breakdown voltage by shortening the time period in which the potentials of the first conductive plate and the second conductive plate vary when the potential of source wiring 21 or drain wiring 22 changes.

Embodiment 4

Figure 8:
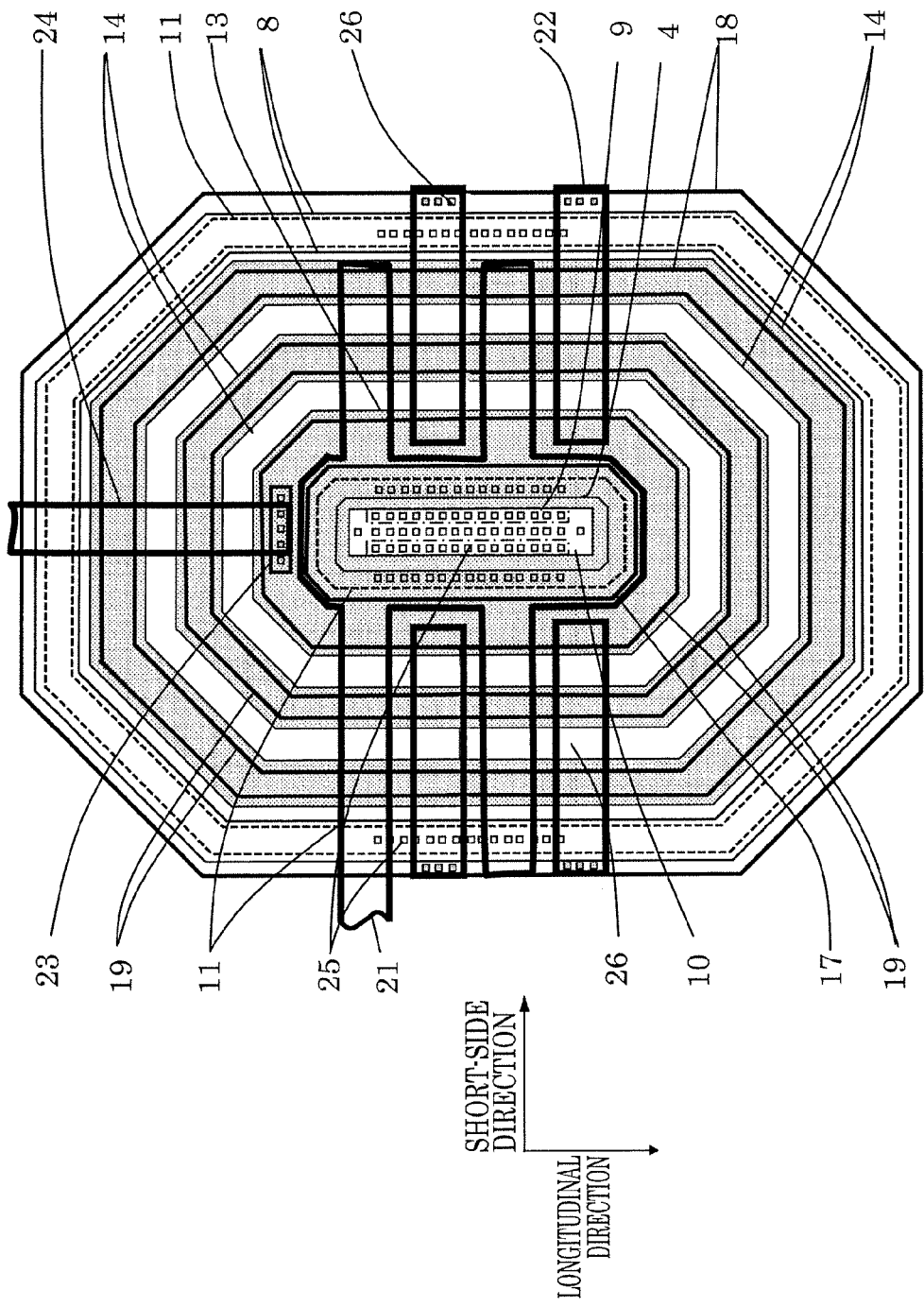
FIG. 8 is a plan view schematically illustrating a semiconductor device according to Embodiment 4.

Concerning a semiconductor device according to Embodiment 4, a plan view of a lateral P-channel MOS transistor is shown in FIG. 8 as an example.

Unlike disposition of drain wiring 22 and source wiring 21 of Embodiment 3 illustrated in FIG. 7, in the present embodiment, as shown in FIG. 8, drain wiring 22 and source wiring 21 that are elongated in parallel to be adjacent in the short-side direction are alternately disposed in the longitudinal direction.

By adopting the above configuration, the effect of stabilizing the potentials of first floating field plate 14 and second floating field plate 19 is expected, even when the lateral P-channel MOS transistor operates at a high speed.

As described above, in the semiconductor device according to Embodiment 4, in plan view, a plurality of source wirings 21 and a plurality of drain wirings 22 that intersect the linear region of the at least one first conductive plate (first floating field plate 14) and the linear region of the at least one second conductive plate (second floating field plate 19) are alternately disposed in the longitudinal direction.

It is conceivable that according to this, even when the semiconductor device operates at a high speed, the potentials of the first conductive plate and the second conductive plate are stabilized to variation in the drain voltage and the source voltage.

Embodiment 5

Figure 9:
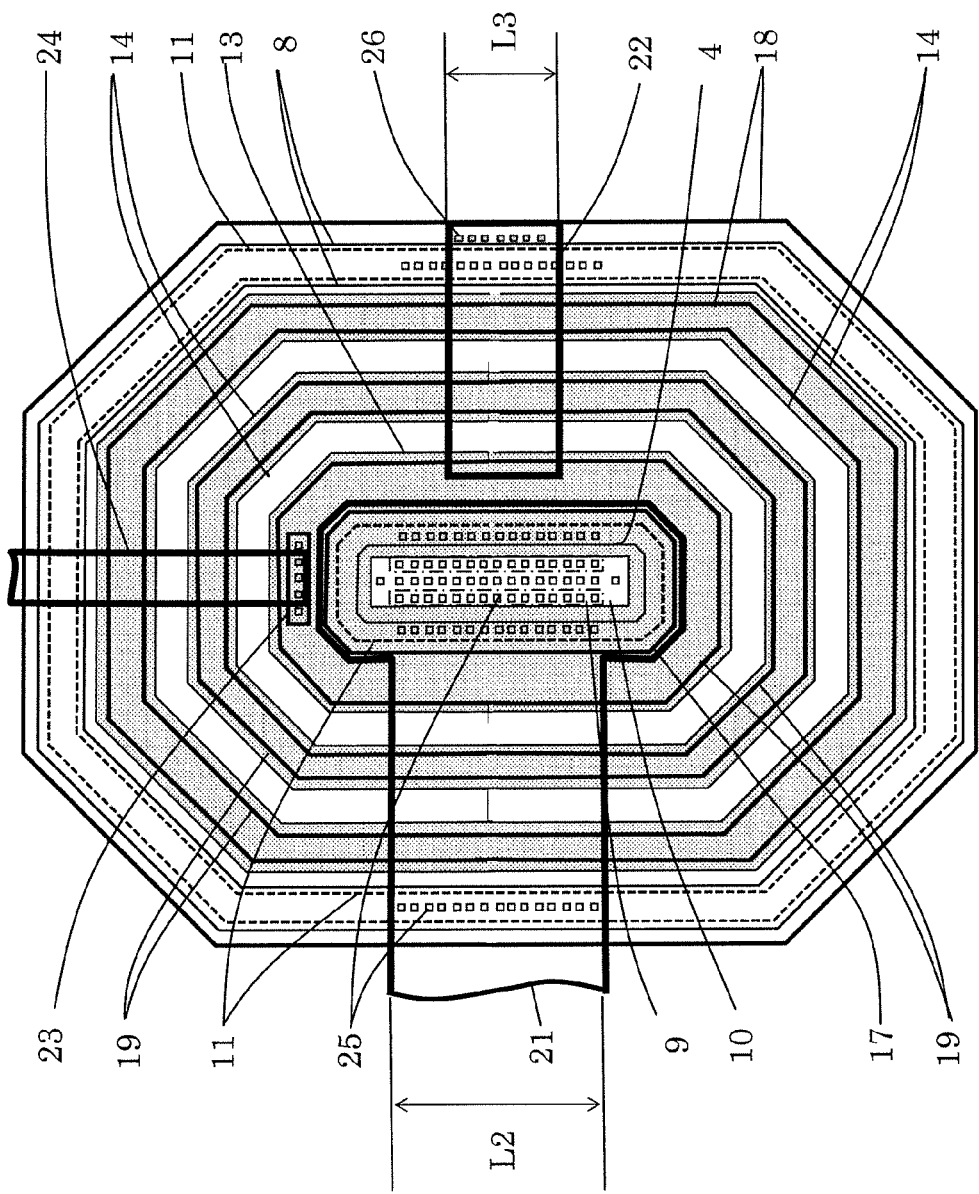
FIG. 9 is a plan view schematically illustrating a semiconductor device according to Embodiment 5.

Concerning a semiconductor device according to Embodiment 5, a plan view of a lateral P-channel MOS transistor is shown in FIG. 9 as an example.

Unlike a wiring width ratio (L3/L2)=1 (fixed) of width L3 in the longitudinal direction of drain wiring 22 and width L2 in the longitudinal direction of source wiring 21 of Embodiment 1 shown in FIG. 1, in the present embodiment, as one example is shown in FIG. 9, a wiring width ratio (L3/L2) of width L3 in the longitudinal direction of drain wiring 22 and width L2 in the longitudinal direction of source wiring 21 is varied in a range of ⅓ to 3 inclusive.

Figure 10:
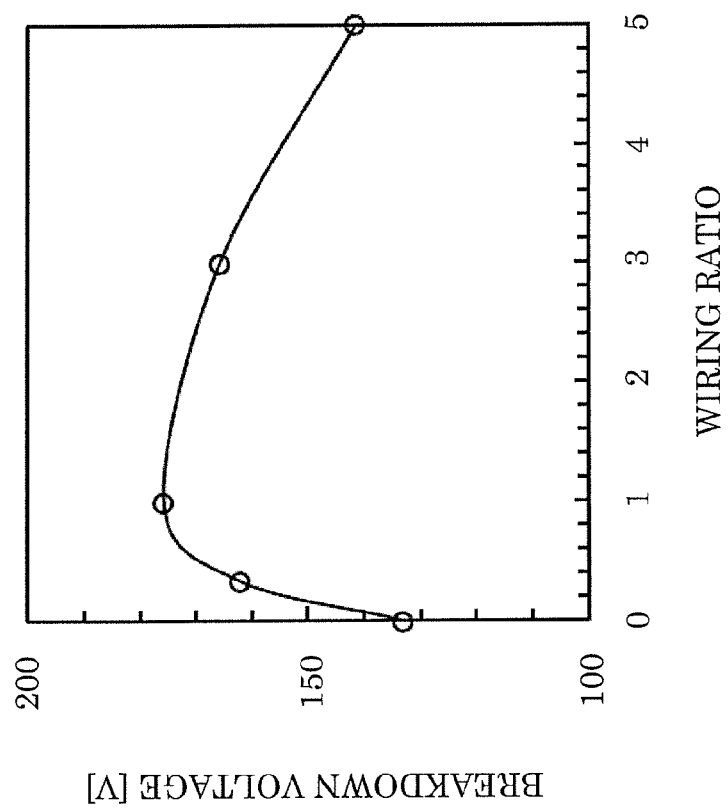
FIG. 10 shows a relationship between a breakdown voltage and a wiring width ratio of a width in a longitudinal direction of a drain wiring and a width in a longitudinal direction of a source wiring in the semiconductor device according to Embodiment 5.

FIG. 10 shows a breakdown voltage in a case where a wiring width ratio (L3/L2) of width L3 in the longitudinal direction of drain wiring 22 and width L2 in the longitudinal direction of source wiring 21 is varied within a range of 0 to 5 inclusive.

As is obvious from FIG. 16, a breakdown voltage shows a maximum value in the wiring width ratio (L3/L2)=1, and when the wiring width ratio (L3/L2) deviates from a range of ⅓ to 3 inclusive, a breakdown voltage abruptly lowers. Therefore, as a realistic wiring width ratio, the wiring width ratio (L3/L2) may be set within a range of ⅓ to 3 inclusive.

Note that if the wiring width ratio (L3/L2) is set within a range of ½ to 1.5 inclusive as the wiring width ratio, the breakdown voltage can be stably obtained in substantially a vicinity of a maximum value.

As described above, in the semiconductor device according to Embodiment 5, a ratio of a total dimension in the longitudinal direction of a portion where the linear regions of the first conductive plate (that is, first floating field plate 14) and the second conductive plate (that is, second floating field plate 19), and the high voltage wiring overlap, and a total dimension in the longitudinal direction of a portion where the linear regions overlap the low voltage wiring is in a range of ⅓ to 3 in plan view, in addition to the configurations of the semiconductor devices according to Embodiment 1 to Embodiment 4.

According to the above, a breakdown voltage of the semiconductor device can be stabilized in the vicinity of the maximum value.

Embodiment 6

Figure 11:
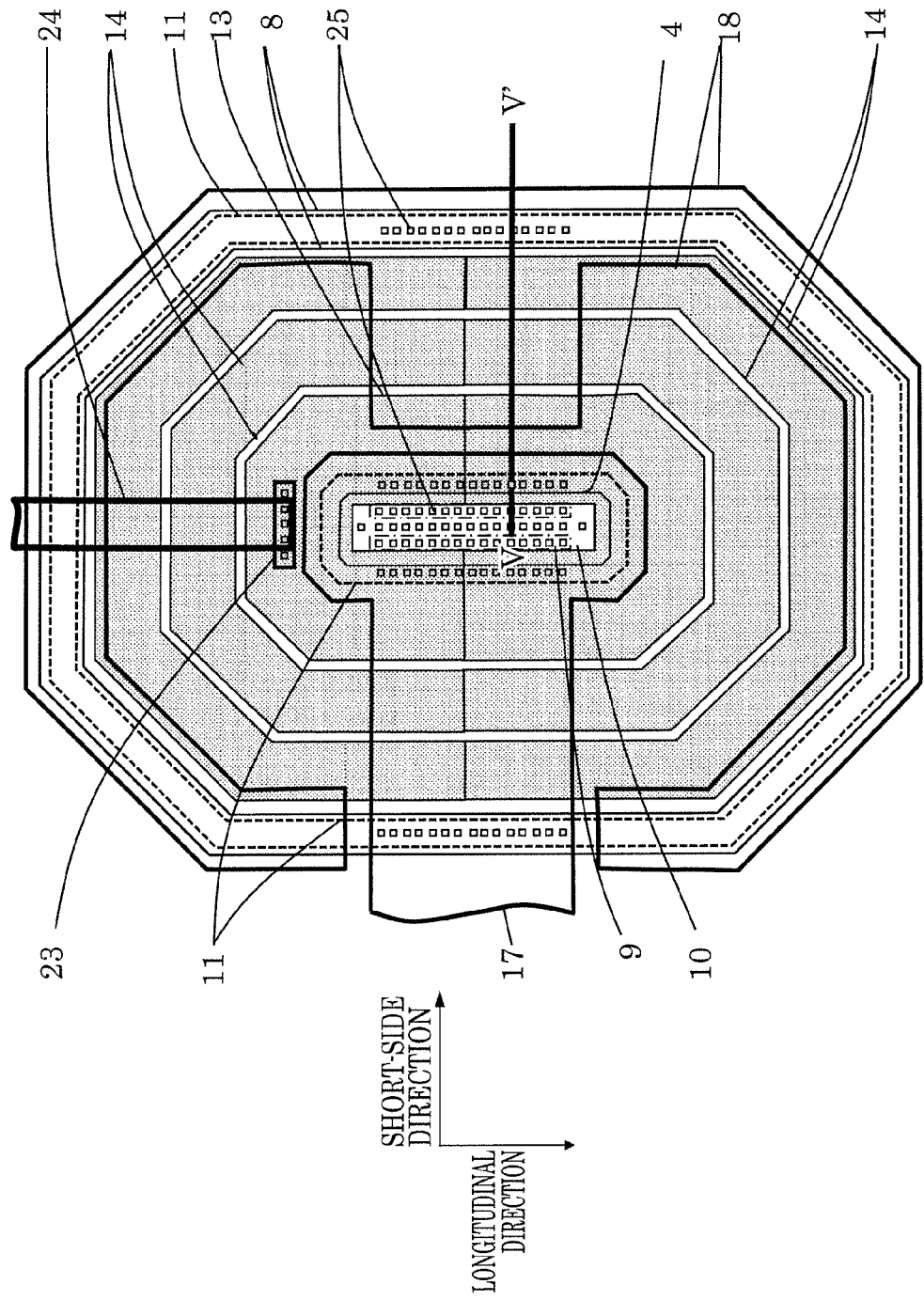
FIG. 11 is a plan view schematically illustrating a semiconductor device according to Embodiment 6.
Figure 12:
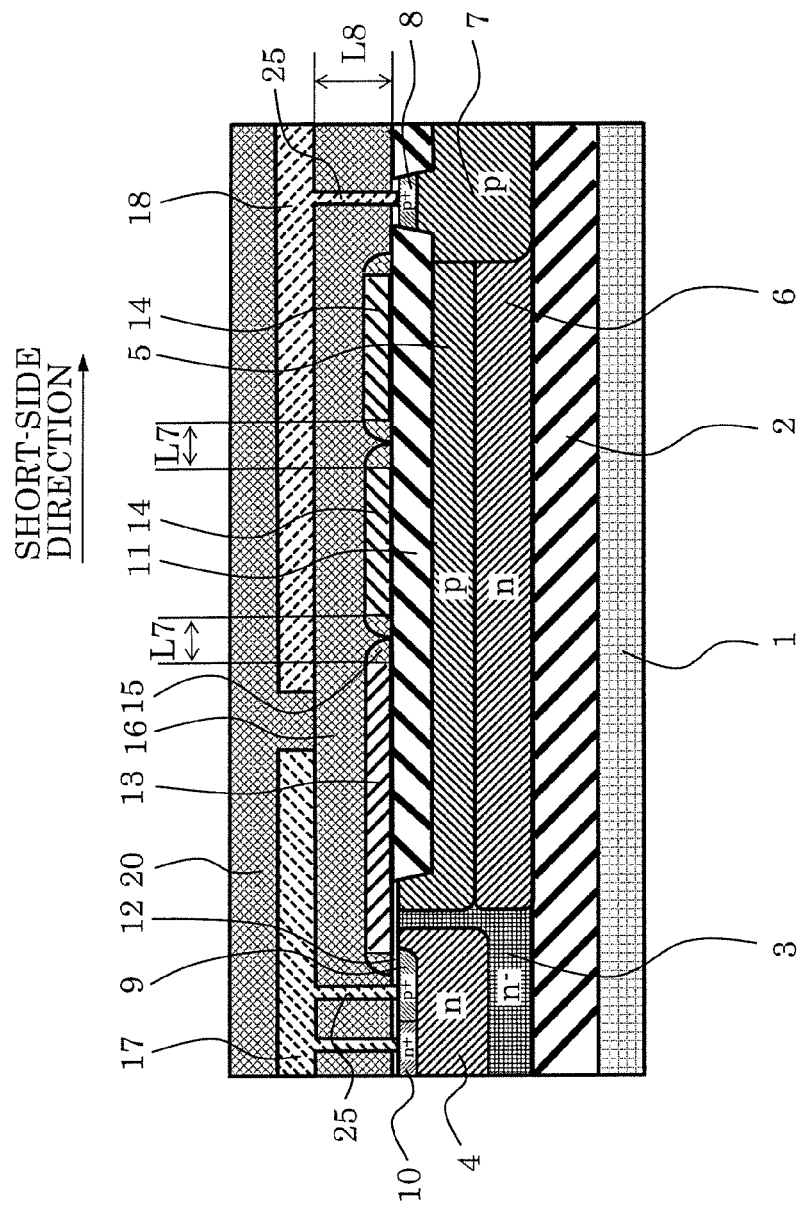
FIG. 12 is a schematic sectional view along line V-V' in FIG. 11 in the semiconductor device according to Embodiment 6.

Concerning a semiconductor device according to Embodiment 6, a plan view and a sectional view of a lateral P-channel MOS transistor are respectively shown in FIGS. 11 and 12, as an example.

The semiconductor devices according to Embodiment 1 to Embodiment 5 described above are each of a floating field plate structure of the two layers that are first floating field plate 14 and second floating field plate 19, but in order to obtain the effect of the present disclosure, the floating field plate structure of two layers is not necessarily required.

Even with a floating field plate structure of one layer, an effect close to the effect in the case of the floating field plate structure of two layers can be obtained by narrowing the space between the adjacent floating field plates.

Capacitive coupling between the respective floating field plates of the floating field plates of two layers mainly relates to the film thickness of second insulation film 16 and a lateral dimension in which the respective floating field plates overlap each other. On the other hand, capacitive coupling between the respective floating field plates of the floating field plate structure of one layer mainly relates to the film thickness of the floating field plates and a dimension in the lateral direction between the floating field plates.

If capacitive coupling of the floating field plate of two layers and capacitive coupling of the floating field plate of one layer are made substantially the same, the same effects can be expected. Accordingly, a standard is to make a dimension of the space between the floating field plates of the floating field plate structure of one layer equal to or less than the film thickness of second insulation film 16 in the floating field plate of two layers.

The present Embodiment is of a floating field plate structure of one layer formed of first floating field plate 14, as shown in FIGS. 11 and 12.

In the present Embodiment, source electrode 17 and drain electrode 18 are also used as source wiring 21 and drain wiring 22 in Embodiment 1 respectively. Accordingly, hereinafter, source electrode 17 is assumed to include a function as source wiring, and drain electrode 18 is assumed to include a function as drain wiring.

As is obvious from FIGS. 11 and 12, in the present embodiment, a space (L7) between adjacent first floating field plates 14 is narrower as compared with the space of first floating field plates 14 in Embodiment 1. Here, the space is made narrower than a film thickness (L8) of second insulation film 16 shown in a sectional view in FIG. 12. A location (L7) where the space between adjacent first floating field plates 14 is located is a region where source electrode 17 that is high voltage wiring and drain electrode 18 that is low voltage wiring, and p type drift region 5 located in an upper portion of low concentration n– type semiconductor layer 3 face each other, and where an electric field by the potential of wiring is directly exerted. By narrowing the space (L7), the electric field is influenced indirectly across first floating field plates 14 rather than directly influenced by the potential of the wiring, so that the electric field is relaxed.

As described above, in the semiconductor device according to Embodiment 6 includes: semiconductor layer 3 located on a principal surface of supporting substrate 1; body region 4 located in an upper portion of semiconductor layer 3, body region 4 having a first conductivity type; drain region 8 located in an upper portion of semiconductor layer 3, drain region 8 having a second conductivity type, drain region 8 being apart from body region 4; source region 9 located in an upper portion of body region 4, source region 9 having the second conductivity type; drift region 5 located between drain region 8 and body region 4 in semiconductor layer 3, drift region 5 having the second conductivity type; first insulator region 11 (STI region 11) located in an upper portion of semiconductor layer 3, first insulator region 11 being located between body region 4 and drain regions 7, 8, first insulator region 11 overlapping drift region 5; gate insulation film 12 located on semiconductor layer 3, the gate insulation film being located from a part on body region 4 to an end portion of first insulator region; gate electrode 13 located on at least part of the gate insulation film and at least part of first insulator region 11; at least one conductive plate (first floating field plate 14) located on first insulator region 11, the at least one conductive plate being located between gate electrode 13 and drain region 8, the at least one conductive plate being in an electrically floating state; a second insulator region (second insulation film 16) located on first insulator region 11, gate electrode 13, and the at least one conductive plate; source wiring 21 located above the second insulator region, source wiring 21 electrically connected to source region 9; and drain wiring 22 located above the second insulator region, drain wiring 22 electrically connected to drain region 8. Here, in plan view, source region 9 and drain region 8 are elongated along a longitudinal direction that is a direction in which facing lengths are longest, and are disposed side by side in a short-side direction that is a direction orthogonal to the longitudinal direction, In plan view, the at least one conductive plate each have a linear region elongated along the longitudinal direction to face each other, and a curved region connecting terminal end portions of the linear regions in the longitudinal direction in a folded line or circular arc shape. In plan view, high voltage wiring of either one of source wiring 21 and drain wiring 22 is elongated in the short-side direction to intersect the linear regions of the at least one conductive plate. In plan view, low voltage wiring of the other one of source wiring 21 and drain wiring 22 is elongated in the short-side direction to intersect the linear region of the at least one conductive plate. An interval in a short-side direction between the at least one conductive plate and gate electrode 13 adjacent to the at least one conductive plate or an interval in a short-side direction between adjacent conductive plates among the at least one conductive plate is shorter than a thickness of the second insulator region.

According to the above, at least one layer of conductive plates can be adopted, and even when the number of conductive plates is one, for example, the effect close to the effect of the configuration having the conductive plates of two layers in Embodiments 1 to 5 can be obtained.

Here, it is possible that buried insulation film 2 is located between supporting substrate 1 and semiconductor layer 3.

It is also possible that in plan view, a high voltage side region of either one of source region 9 and drain region 8 is completely surrounded by a low voltage side region of the other one of source region 9 and drain region 8, and that in plan view, the high voltage side region is completely surrounded by the at least one conductive plate.

Note that in Embodiment 1 to Embodiment 6, STI region 11 that is the first insulator region, and second insulation film 16 that is the second insulator region, and third insulation film 20 that is the third insulator region are each not limited to a single insulation film, but each may be a plurality of insulation films that are stacked in layer.

Further, in Embodiment 1 to Embodiment 5, source wiring 21 and drain wiring 22 are located on the same insulation film, and in Embodiment 6, source electrode 17 and drain electrode 18 are located on the same insulation film. However, the present disclosure is not limited to this, and source wiring and drain wiring, or source electrode and drain electrode may be located on different insulation films.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can realize enhancement and stabilization of a breakdown voltage of a high breakdown voltage MOS transistor, and is useful specially in a high breakdown voltage MOS transistor that is mounted on a device of a target breakdown voltage of 100 V or more like an on-vehicle device.

What is claimed is:

1. A semiconductor device, comprising:
a semiconductor layer located on a principal surface of a supporting substrate;
a body region located in an upper portion of the semiconductor layer, the body region having a first conductivity type;
a drain region located in an upper portion of the semiconductor layer, the drain region having a second conductivity type, the drain region being apart from the body region;
a source region located in an upper portion of the body region, the source region having the second conductivity type;
a drift region located between the drain region and the body region in the semiconductor layer, the drift region having the second conductivity type;
a first insulator region located in an upper portion of the semiconductor layer, the first insulator region being located between the body region and the drain region, the first insulator region overlapping the drift region;
a gate insulation film located on the semiconductor layer, the gate insulation film being located from a part on the body region to an end portion of the first insulator region;
a gate electrode located on at least part of the gate insulation film and at least part of the first insulator region;
at least one first conductive plate located on the first insulator region, the at least one first conductive plate being located between the gate electrode and the drain region, the at least one first conductive plate being in an electrically floating state;
a second insulator region located on the first insulator region, the gate electrode, and the at least one first conductive plate;
at least one second conductive plate located on the second insulator region where at least the gate electrode and the at least one first conductive plate are not located, the at least one second conductive plate being in an electrically floating state;
a third insulator region located on the second insulator region, above the gate electrode and on the at least one second conductive plate;
source wiring located above the third insulator region, the source wiring electrically connected to the source region; and
drain wiring located above the third insulator region, the drain wiring electrically connected to the drain region,
wherein in plan view, the source region and the drain region are elongated along a longitudinal direction that is a direction in which facing lengths are longest, and are disposed side by side in a short-side direction that is a direction orthogonal to the longitudinal direction,
in plan view, the at least one first conductive plate and the at least one second conductive plate each have a linear region elongated along the longitudinal direction to face each other, and a curved region connecting terminal end portions of the linear regions in the longitudinal direction in a folded line or circular arc shape,
in plan view, high voltage wiring of either one of the source wiring and the drain wiring is elongated in the short-side direction to intersect the linear regions of the at least one first conductive plate and the at least one second conductive plate, and
in plan view, low voltage wiring of the other one of the source wiring and the drain wiring is elongated in the short-side direction to intersect at least one of (i) the linear region of the at least one first conductive plate and (ii) the linear region of the one second conductive plate.

2. The semiconductor device according to claim 1, wherein a buried insulation film is located between the supporting substrate and the semiconductor layer.

3. The semiconductor device according to claim 1, wherein in plan view, a high voltage side region of either one of the source region and the drain region is completely surrounded by a low voltage side region of the other one of the source region and the drain region, and
in plan view, the high voltage side region is completely surrounded by the at least one first conductive plate and the at least one second conductive plate.

4. The semiconductor device according to claim 1, wherein in plan view, the low voltage wiring intersects the linear region of each of the at least one first conductive plate and the linear region of each of the at least one second conductive plate.

5. The semiconductor device according to claim 1, wherein in plan view, a width in the longitudinal direction where the linear region of the at least one first conductive plate and the linear region of the at least one second conductive plate overlap the low voltage wiring is reducing or increasing toward a high voltage side region of either one of the drain region and the source region.

6. The semiconductor device according to claim 1, wherein in plan view, the source wiring and the drain wiring that intersect the linear region of the at least one first conductive plate, and the linear region of the at least one second conductive plate are elongated side by side in the longitudinal direction, and a space in the longitudinal direction between the source wiring and the drain wiring is narrower than widths in the longitudinal direction of the source wiring and the drain wiring.

7. The semiconductor device according to claim 6, wherein in plan view, a plurality of the source wirings and a plurality of the drain wirings that intersect the linear region of the at least one first conductive plate and the linear region of the at least one second conductive plate are alternately disposed in the longitudinal direction.

8. The semiconductor device according to claim 1, wherein in plan view, a ratio of a total dimension in the longitudinal direction of a part where the linear region of the at least one first conductive plate and the linear region of the at least one second conductive plate overlap the high voltage wiring, and a total dimension in the longitudinal direction of a part where the linear region of the at least one first conductive plate and the linear region of the at least one second conductive plate overlap the low voltage wiring is in a range of ⅓ to 3 inclusive.

9. A semiconductor device, comprising:
a semiconductor layer located on a principal surface of a supporting substrate;
a body region located in an upper portion of the semiconductor layer, the body region having a first conductivity type;
a drain region located in an upper portion of the semiconductor layer, the drain region having a second conductivity type, the drain region being apart from the body region;
a source region located in an upper portion of the body region, the source region having the second conductivity type;
a drift region located between the drain region and the body region in the semiconductor layer, the drift region having the second conductivity type;
a first insulator region located in an upper portion of the semiconductor layer, the first insulator region being located between the body region and the drain region, the first insulator region overlapping the drift region;
a gate insulation film located on the semiconductor layer, the gate insulation film being located from a part on the body region to an end portion of the first insulator region;
a gate electrode located on at least part of the gate insulation film and at least part of the first insulator region;
at least one conductive plate located on the first insulator region, the at least one conductive plate being located between the gate electrode and the drain region, the at least one conductive plate being in an electrically floating state;
a second insulator region located on the first insulator region, the gate electrode, and the at least one conductive plate;
source wiring located above the second insulator region, the source wiring electrically connected to the source region; and
drain wiring located above the second insulator region, the drain wiring electrically connected to the drain region,
wherein in plan view, the source region and the drain region are elongated along a longitudinal direction that is a direction in which facing lengths are longest, and are disposed side by side in a short-side direction that is a direction orthogonal to the longitudinal direction,
in plan view, the at least one conductive plate each have a linear region elongated along the longitudinal direction to face each other, and a curved region connecting terminal end portions of the linear regions in the longitudinal direction in a folded line or circular arc shape,
in plan view, high voltage wiring of either one of the source wiring and the drain wiring is elongated in the short-side direction to intersect the linear regions of the at least one conductive plate,
in plan view, low voltage wiring of the other one of the source wiring and the drain wiring is elongated in the short-side direction to intersect the linear region of the at least one conductive plate, and
an interval in a short-side direction between the at least one conductive plate and the gate electrode adjacent to the at least one conductive plate or an interval in a short-side direction between adjacent conductive plates among the at least one conductive plate is shorter than a thickness of the second insulator region.

10. The semiconductor device according to claim 9, wherein a buried insulation film is located between the supporting substrate and the semiconductor layer.

11. The semiconductor device according to claim 9, wherein in plan view, a high voltage side region of either one of the source region and the drain region is completely surrounded by a low voltage side region of the other one of the source region and the drain region, and
in plan view, the high voltage side region is completely surrounded by the at least one conductive plate.

* * * * *